(12) United States Patent
Yoon et al.

(10) Patent No.: US 12,588,379 B2
(45) Date of Patent: *Mar. 24, 2026

(54) DISPLAY DEVICE

(71) Applicant: SAMSUNG DISPLAY CO., LTD., Yongin-si (KR)

(72) Inventors: Youngsoo Yoon, Yongin-si (KR); Hyunji Kang, Yongin-si (KR); Dongeup Lee, Yongin-si (KR); Yunkyeong In, Yongin-si (KR); Hyunji Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

This patent is subject to a terminal disclaimer.

(21) Appl. No.: 18/459,384

(22) Filed: Aug. 31, 2023

(65) Prior Publication Data

US 2023/0413628 A1     Dec. 21, 2023

Related U.S. Application Data

(63) Continuation of application No. 17/217,598, filed on Mar. 30, 2021, now Pat. No. 11,751,448.

(30) Foreign Application Priority Data

Jun. 11, 2020   (KR) ........................ 10-2020-0070970

(51) Int. Cl.
G09G 3/3208        (2016.01)
G06F 1/18          (2006.01)
(Continued)

(52) U.S. Cl.
CPC ........... H10K 59/131 (2023.02); G06F 1/189 (2013.01); G09G 3/3208 (2013.01); H10K 59/126 (2023.02)

(58) Field of Classification Search
CPC .... H10K 59/131; H10K 59/352; H10K 50/80; H10K 59/122; H10K 59/121;
(Continued)

(56) References Cited

U.S. PATENT DOCUMENTS 10,719,682 B2    7/2020  Choi et al.
2015/0032088 A1  1/2015  Grattoni et al.
(Continued)

FOREIGN PATENT DOCUMENTS

CN       107230746 A    10/2017
CN       109285861 A     1/2019
(Continued)

*Primary Examiner* — Adam R. Giesy
(74) *Attorney, Agent, or Firm* — Womble Bond Dickinson (US) LLP

(57) ABSTRACT

A display device includes a substrate including a main display area, main display elements being in the main display area; a component area, auxiliary display elements and a transmission area being in the component area; and a peripheral area outside the main display area; an initialization voltage line in the main display area and extending in a first direction; a bottom metal layer in the component area between the substrate and the auxiliary display elements; and a bias line in the main display area and extending in the first direction, the bias line being connected to the bottom metal layer and being at a same layer as the initialization voltage line, wherein the bias line and the initialization voltage line are alternately arranged along a second direction crossing the first direction, in a first region of the main display area around the component area.

14 Claims, 21 Drawing Sheets

(51) Int. Cl.
  *H10K 59/126*     (2023.01)
  *H10K 59/131*     (2023.01)

(58) Field of Classification Search
  CPC ...... H10K 59/88; H10K 59/126; H10K 59/65;
      G06F 1/189; G06F 3/0412; G06F 3/044;
      G06F 2203/04103; G06F 1/1626; G06F
      1/1643; G06F 1/1686; G09G 3/3208;
      G09G 3/3225; G09G 2330/06
  See application file for complete search history.

(56)                References Cited

U.S. PATENT DOCUMENTS

| | | | |
|---|---|---|---|
| 2015/0130691 A1 | 5/2015 | Jeon | |
| 2017/0278898 A1 | 9/2017 | Kim et al. | |
| 2019/0019441 A1 | 1/2019 | Shin et al. | |
| 2019/0027092 A1 | 1/2019 | Matsueda | |
| 2019/0181211 A1 | 6/2019 | Bae et al. | |
| 2019/0221165 A1 | 7/2019 | Park et al. | |
| 2020/0119126 A1 | 4/2020 | Jo et al. | |
| 2020/0126483 A1 | 4/2020 | Chen et al. | |
| 2021/0126066 A1* | 4/2021 | Hwang | H10K 50/868 |
| 2021/0159286 A1 | 5/2021 | Ma et al. | |
| 2021/0249494 A1* | 8/2021 | You | H10K 59/131 |

FOREIGN PATENT DOCUMENTS

| | | |
|---|---|---|
| CN | 110047428 A | 7/2019 |
| CN | 110867476 A | 3/2020 |
| CN | 111029366 A | 4/2020 |
| KR | 10-2016-0053376 A | 5/2016 |
| KR | 10-2018-0049296 A | 5/2018 |
| KR | 10-2019-0007570 A | 1/2019 |
| KR | 10-2019-0030907 A | 3/2019 |
| KR | 10-2019-0071029 A | 6/2019 |

* cited by examiner

DISPLAY DEVICE

CROSS-REFERENCE TO RELATED APPLICATIONS

This application is a continuation of U.S. patent application Ser. No. 17/217,598, filed Mar. 30, 2021, which claims priority to and the benefit of Korean Patent Application No. 10-2020-0070970, filed Jun. 11, 2020, the entire content of both of which is incorporated herein by reference.

BACKGROUND

1. Field

One or more embodiments relate to a display device, and more particularly, to a display panel including an extended display area such that an image is displayed even in a region in which a component, that is, an electronic element is arranged, and a display device including the display panel.

2. Description of Related Art

Recently, the usage of display devices has diversified. Further, as display devices have become thinner and lighter, their range of use has gradually been extended.

As display devices are variously utilized, there may be various methods in designing the shape of display devices, and the number of functions that may be combined or associated with display devices has increased.

SUMMARY

One or more embodiments include a display panel including a display area that is extended such that an image is displayed even in a region in which a component, that is, an electronic element is arranged, and a display device including the display panel. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display device includes a substrate including a main display area, main display elements being in the main display area, a component area, auxiliary display elements and a transmission area being in the component area, and a peripheral area outside the main display area; an initialization voltage line in the main display area and extending in a first direction, a bottom metal layer in the component area between the substrate and the auxiliary display elements, and a bias line in the main display area and extending in the first direction, the bias line being connected to the bottom metal layer and being at a same layer as the initialization voltage line, wherein the bias line and the initialization voltage line are alternately arranged along a second direction crossing the first direction, in a first region of the main display area around the component area.

The initialization voltage line may include a first initialization voltage line and a second initialization voltage line, and wherein the bias line, the first initialization voltage line, and the second initialization voltage line may be alternately arranged along the second direction crossing the first direction, in the first region of the main display area.

The first initialization voltage line and the second initialization voltage line may be alternately arranged along the second direction, in a region of the main display area that excludes the first region.

The display device may further include a bias voltage supply line arranged in the peripheral area, wherein the bias line may be connected to the bias voltage supply line.

A bias voltage applied to the bias line may be different from an initialization voltage applied to the initialization voltage line.

The display device may further include main pixel circuits respectively connected to the main display elements and corresponding to the main display area, and auxiliary pixel circuits respectively connected to the auxiliary display elements and corresponding to the component area, wherein the bottom metal layer may be between the substrate and a circuit layer including the auxiliary pixel circuits.

A left main pixel circuit and a right main pixel circuit may be symmetric with respect to the bias line.

The main pixel circuits may include a pair of first main pixel circuits that are symmetric with respect to the bias line, and a pair of second main pixel circuits that are symmetric with respect to the initialization voltage line, the pair of second main pixel circuits neighboring the pair of first main pixel circuits in the second direction.

The display device may further include a first horizontal voltage line extending in the second direction and connected to the first initialization voltage line, and a second horizontal voltage line extending in the second direction and connected to the second initialization voltage line.

The display device may further include a dummy line arranged in a second region of the main display area and extending in the first direction, wherein the dummy line, the first initialization voltage line, and the second initialization voltage line may be alternately arranged along the second direction in the second region.

The dummy line may be at a same layer as the bias line.

The display device may further include a driving voltage line on the bias line and extending in the first direction.

The display device may further include a data line on the bias line and extending in the first direction.

The bottom metal layer may include a bottom hole corresponding to the transmission area.

The first initialization voltage line and the second initialization voltage line may be at different layers.

The dummy line may be electrically connected to the first initialization voltage line or the second initialization voltage line.

The first initialization voltage line in the first region and the first initialization voltage line in the second region may be integrally formed, and the second initialization voltage line in the first region and the second initialization voltage line in the second region may be integrally formed.

According to one or more embodiments, a display device includes a substrate including a main display area and a component area, main display elements being in the main display area, and auxiliary display elements and a transmission area being in the component area, a first initialization voltage line in the main display area and including a first vertical voltage line and a first horizontal voltage line, the first vertical voltage line extending in a first direction, and the first horizontal voltage line extending in a second direction crossing the first direction and being connected to the first vertical voltage line, a second initialization voltage line in the main display area and including a second vertical voltage line and a second horizontal voltage line, the second vertical voltage line extending in the first direction, and the second horizontal voltage line extending in the second direction and being connected to the second vertical voltage line, a bottom metal layer in the component area between the substrate and the auxiliary display elements configured to drive the auxiliary display elements, and a bias line along the main display area, the bias line being connected to the bottom metal layer, and extending in the first direction, wherein the bias line, the first vertical voltage line, and the second vertical voltage line are alternately arranged along the second direction in a first region of the main display area around the component area.

A bias voltage applied to the bias line may be different from a voltage applied to the first initialization voltage line and the second initialization voltage line.

The first vertical voltage line and the second vertical voltage line may be alternately arranged along the second direction in a second region of the main display area.

The display device may further include a dummy line in a second region of the main display area and extending in the first direction, wherein the dummy line, the first vertical voltage line, and the second vertical voltage line may be alternately arranged along the second direction in the second region.

The bias line, the first vertical voltage line, and the second vertical voltage line may be at a same layer.

The display device may further include main pixel circuits in the main display area and configured to drive the main display elements, wherein a left main pixel circuit and a right main pixel circuit may be symmetric with respect to the bias line.

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 7 is a cross-sectional view of a portion of a display panel according to one or more example embodiments;

FIG. 11 is a cross-sectional view of the pixel circuit taken along the line I-I' of FIG. 10;

FIG. 13 is an enlarged plan view of pixel circuits arranged in a region B of FIG. 9;

FIG. 15 is an enlarged plan view of pixel circuits arranged in a region D of FIG. 9;

DETAILED DESCRIPTION

Figure 1:
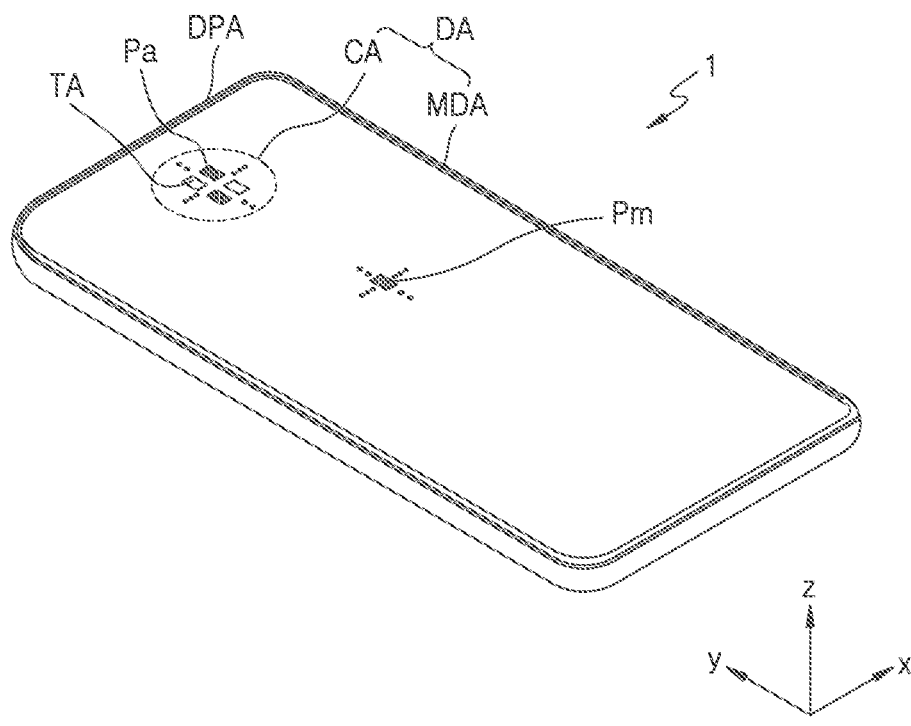
FIG. 1 is a perspective view of a display device according to one or more example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, example embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those elements that are the same or are in correspondence with each other are rendered the same reference numeral regardless of the figure number, and redundant explanations are omitted.

It will be understood that when a layer, region, or element is referred to as being "formed on," another layer, region, or element, it can be directly or indirectly formed on the other layer, region, or element. By way of example, intervening layers, regions, or components may be present. Sizes of elements in the drawings may be exaggerated or reduced for convenience of explanation. In other words, because sizes and thicknesses of elements in the drawings are arbitrarily illustrated for convenience of explanation, the following embodiments are not limited thereto.

As used herein, "on a plan view" means that an objective portion is viewed from above, and "on a cross-sectional view" means that a cross-section of an objective portion taken vertically is viewed from a lateral side. As used herein, when it is referred that a first element "overlaps" a second element, the first element is arranged above or below the second element.

As used herein, "ON" used in associated with an element state may denote an activated state of the element, and "OFF" may denote an inactivated state of the element. "ON" used in associated with a signal received by an element may denote a signal that activates the element, and "OFF" may denote a signal that inactivates the element. The element may be activated by a high-level voltage or a low-level voltage. For example, a p-channel transistor is activated by a low-level voltage, and an n-channel transistor is activated by a high-level voltage. Therefore, it should be understood that "ON" voltages for a p-channel transistor and an n-channel transistor are opposite voltage levels (low vs high).

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display device 1 according to one or more example embodiments.

Referring to FIG. 1, the display device 1 includes a display area DA and a peripheral area DPA outside the display area DA. The display area DA includes a component area CA and a main display area MDA at least partially surrounding the component area CA. For example, the component area CA and the main display area MDA may display an image individually or in cooperation with each other. The peripheral area DPA may include a kind of non-display area in which display elements are not arranged. The display area DA may be entirely surrounded by the peripheral area DPA along the edge or periphery of the display area DA.

It is shown in FIG. 1 that one component area CA is arranged inside the main display area MDA. In another embodiment, the display device 1 may include two or more component areas CA. The shapes and sizes of a plurality of component areas CA may be different from each other. In a view in a direction approximately perpendicular to the top surface of the display device 1, the component area CA may have various shapes such as a circle, an ellipse, a polygon including a quadrangle, a hexagon, and an octagon, a star shape, or a diamond shape. In addition, though it is shown in FIG. 1 that, in a view in a direction approximately perpendicular to the top surface of the display device 1, the component area CA is arranged at the top (a positive (+) y-direction) center of the main display area MDA having an approximately quadrangular shape, the component area CA may be arranged on one side of the main display area MDA, which has a quadrangular shape, for example, on the top right side or the top left side.

The display device 1 may display an image by using a plurality of main sub-pixels Pm and a plurality of auxiliary sub-pixels Pa, the main sub-pixels Pm being arranged in the main display area MDA, and the auxiliary sub-pixels Pa being arranged in the component area CA.

As described below with reference to FIG. 2, a component 40, which is an electronic element, may be arranged in the component area CA below the display panel, the component 40 being arranged to correspond to the component area CA. The component 40 may include a camera that uses an infrared ray or visible light, etc. and may include an imaging element. In some embodiments, the component 40 may include a solar battery, a flash, a proximity sensor, an illuminance sensor, and an iris sensor. In some other embodiments, the component 40 may have a function that receives sound. To prevent the function of the component from being limited, the component area CA may include a transmission area TA through which light and/or sound may pass, the light and/or sound being output from the component 40 to the outside or progressing toward the component 40 from the outside. In the display panel and the display device including the display panel according to one or more example embodiments, when light passes through the component area CA, a light transmittance may be 10% or more, more preferably, 40% or more, 25% or more, 50% or more, 85% or more, or 90% or more.

The plurality of auxiliary sub-pixels Pa may be arranged in the component area CA. The plurality of auxiliary sub-pixels Pa may display an image by emitting light. An image displayed on the component area CA may include an auxiliary image and may have a lower resolution than that of an image displayed on the main display area MDA. For example, the component area CA includes the transmission area TA through which light and sound may pass. In the case where sub-pixels are not arranged in the transmission area TA, the number of auxiliary sub-pixels Pa that may be arranged per unit area in the component area CA may be less than the number of main sub-pixels Pm that may be arranged per unit area in the main display area MDA.

Figure 2:
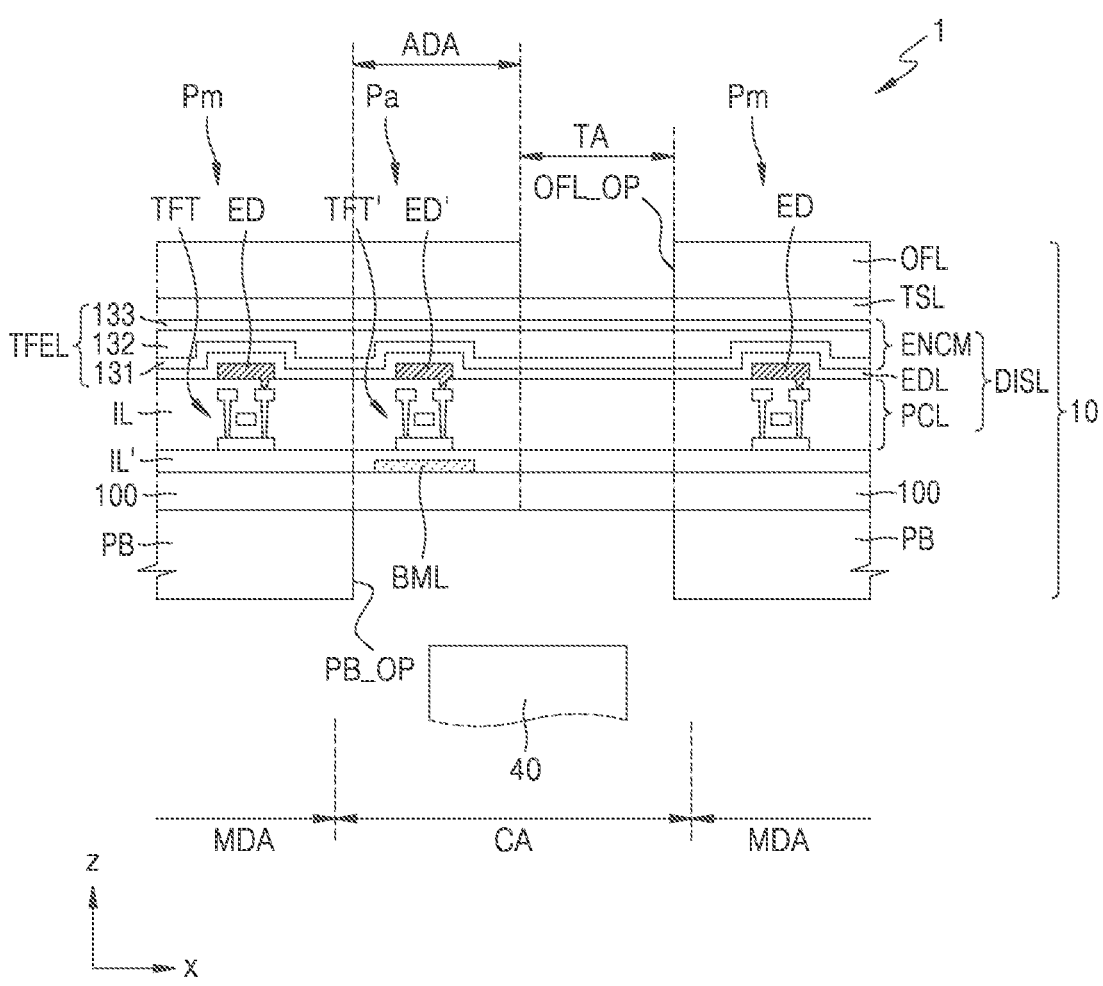
FIG. 2 is a cross-sectional view of a portion of a display device according to one or more example embodiments.

FIG. 2 is a cross-sectional view of a portion of a cross-section of the display device 1 according to one or more example embodiments.

Referring to FIG. 2, the display device 1 may include a display panel 10 and the component 40 overlapping the display panel 10. A cover window (not shown) may be further arranged on the display panel 10, the cover window may be protecting the display panel 10.

The display panel 10 includes the component area CA and the main display area MDA, the component area CA overlapping the component 40, and the main display area MDA displaying a main image. The display panel 10 may include a substrate 100, a display layer DISL, a touchscreen layer TSL, an optical functional layer OFL on the substrate 100, and a panel protection member PB, the panel protection member PB being arranged under the substrate 100.

The display layer DISL may include a circuit layer PCL, a display element layer EDL, and a sealing member ENCM, such as, a thin-film encapsulation layer (TFEL) or a sealing substrate (not shown). The circuit layer PCL includes thin film transistors, e.g., a main thin film transistor TFT and an auxiliary thin film transistor TFT', and the display element layer EDL includes light-emitting diodes, e.g., a main light-emitting diode ED and an auxiliary light-emitting diode ED', which are display elements. Insulating layers IL and IL' may be arranged between the substrate 100 and the display layer DISL, and inside the display layer DISL. For example, the insulating layer IL' may be located between the substrate 100 and the circuit layer PCL, and the insulating layer IL and the circuit layer PCL may be located at substantially the same level on the insulating layer IL'.

The substrate 100 may include an insulative material such as glass, quartz, and polymer resin. The substrate 100 may be a rigid substrate or a flexible substrate that is bendable, foldable, or rollable.

A main sub-pixel Pm and a main thin film transistor TFT may be arranged in the main display area MDA of the display panel 10. The main sub-pixel Pm includes a main light-emitting diode ED and the main thin film transistor TFT connected to the main sub-pixel Pm. An auxiliary sub-pixel Pa and an auxiliary thin film transistor TFT' may be arranged in the component area CA. The auxiliary sub-pixel Pa includes an auxiliary light-emitting diode ED' and the auxiliary thin film transistor TFT' connected to the auxiliary sub-pixel Pa. A region of the component area CA in which auxiliary sub-pixels Pa are arranged may be an auxiliary display area ADA.

In the component area CA, a transmission area TA having no display elements arranged therein may be arranged. The transmission area TA may include a region through which light and/or signal emitted from the component 40 or light and/or signal incident to the component 40 may pass. The component 40 is arranged to correspond to the component area CA. The auxiliary display area ADA and the transmission area TA may be alternately arranged in the component area CA.

A bottom metal layer BML may be arranged in the component area CA. The bottom metal layer BML may be arranged to correspond to below the circuit layer PCL including the auxiliary thin film transistor TFT'. For example, the bottom metal layer BML may be arranged between the auxiliary thin film transistor TFT' and the substrate 100. The bottom metal layer BML may block external light reaching the auxiliary thin film transistor TFT'. In some embodiments, a constant voltage or signal may be applied to the bottom metal layer BML.

The display element layer EDL may be covered by the thin-film encapsulation layer TFEL or a sealing substrate. In some embodiments, the thin-film encapsulation layer TFEL may include at least one inorganic encapsulation layer and at least one organic encapsulation layer. In some embodiments, the thin-film encapsulation layer TFEL may include first and second inorganic encapsulation layers 131 and 133 and an organic encapsulation layer 132 therebetween.

The first and second inorganic encapsulation layers 131 and 133 may include at least one inorganic insulating material from among aluminum oxide, titanium oxide, tantalum oxide, hafnium oxide, zinc oxide, silicon oxide, silicon nitride, and silicon oxynitride. The organic encapsulation layer 132 may include a polymer-based material. Examples of the polymer-based material may include an acrylic resin, an epoxy resin, polyimide, and/or polyethylene.

In the case where the display element layer EDL is sealed by the sealing substrate (not shown), the sealing substrate may face the substrate 100 with the display element layer EDL therebetween. There may be a gap between the sealing substrate and the display element layer EDL. The sealing substrate may include glass. Sealant may be arranged between the substrate 100 and the sealing substrate, the sealant including frit and being arranged in the peripheral area DPA. The sealant arranged in the peripheral area DPA may prevent moisture from penetrating into the display area DA through a lateral surface of the display area DA while surrounding the display area DA.

The touchscreen layer TSL may obtain coordinate information corresponding to an external input, for example, a touch event. The touchscreen layer TSL may include a touch electrode and touch wirings, the touch wirings being connected to the touch electrode. The touch screen layer TSL may sense an external input according to a self-capacitance method or a mutual capacitance method.

The touch screen layer TSL may be on the thin-film encapsulation layer TFEL. In some embodiments, the touchscreen layer TSL may be separately formed on the touchscreen and then coupled to the thin-film encapsulation layer TFEL through an adhesive layer such as an optically clear adhesive (OCA). In some embodiments, the touchscreen layer TSL may be directly formed right on the thin-film encapsulation layer TFEL. In this case, the adhesive layer may not be arranged between the touchscreen layer TSL and the thin-film encapsulation layer TFEL.

The optical functional layer OFL may include an anti-reflection layer. The anti-reflection layer may reduce light (e.g., external light) incident toward the display device 1 from the outside.

In some embodiments, the optical functional layer OFL may include a polarizing film. The optical functional layer OFL may include an opening OFL_OP corresponding to the transmission area TA. Accordingly, the light transmittance of the transmission area TA may significantly improve. A transparent material such as an optically clear resin (OCR) may fill the opening OFL_OP.

In some embodiments, the optical functional layer OFL may include a filter plate including a black matrix and color filters.

A cover window (not shown) may be arranged on the display panel 10 to protect the display panel 10. The optical functional layer OFL may be attached on the cover window by using an optically clear adhesive or attached on the touchscreen layer TSL by using an optically clear adhesive.

The panel protection member PB may be attached to the bottom of the substrate 100 to support and protect the substrate 100. The panel protection member PB may include an opening PB_OP corresponding to the component area CA. Because the opening PB_OP is formed in the panel protection member PB, a light transmittance of the component area CA may improve. The panel protection member PB may include polyethylene terephthalate (PET) or polyimide (PI).

The component area CA may have a larger area than an area where the component 40 is arranged. Accordingly, the area of the opening PB_OP formed in the panel protection member PB may not coincide with the area of the component area CA.

In some embodiments, a plurality of components 40 may be arranged in the component area CA. The functions of the plurality of components 40 may be different from each other. For example, the plurality of components 40 may include at least two components from among a camera (an imaging element), a solar battery, a flash, a proximity sensor, an illuminance sensor, and an iris sensor.

Figure 3:
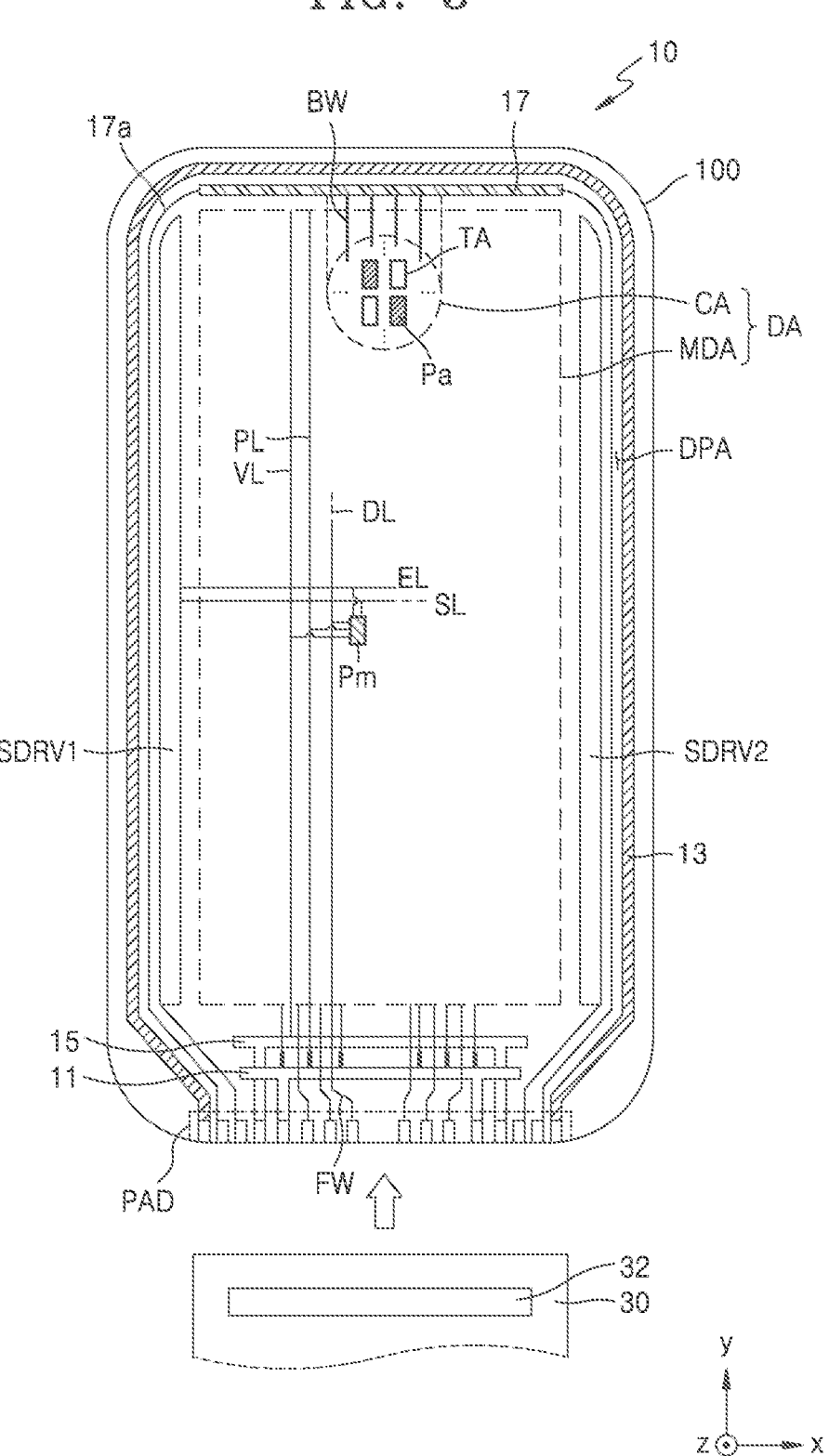
FIG. 3 is a plan view of a display panel according to one or more example embodiments.

FIG. 3 is a plan view of the display panel 10 according to one or more example embodiments.

Referring to FIG. 3, various elements constituting the display panel 10 are arranged on the substrate 100. The substrate 100 includes the display area DA and the peripheral area DPA surrounding the display area DA along the periphery of the display area DA. The display area DA includes a main display area MDA on which a main image is displayed, and a component area CA which includes a transmission area TA and on which an auxiliary image is displayed. The auxiliary image may form a single entire image in cooperation with the main image, or may be an image independent of the main image.

A plurality of main sub-pixels Pm are arranged in the main display area MDA. Each of the plurality of main sub-pixels Pm may include a display element such as an organic light-emitting diode OLED. Each of the plurality of main sub-pixels Pm may emit, for example, red light, green light, blue light, or white light. The main display area MDA may be covered with an encapsulation member and thus may be protected from ambient air, moisture, or the like.

As described above, the component area CA may be arranged on one side of the main display area MDA, or arranged inside the display area DA and surrounded by the main display area MDA. A plurality of auxiliary sub-pixels Pa are arranged in the component area CA. Each of the plurality of auxiliary sub-pixels Pa may include a display element such as an organic light-emitting diode OLED. Each of the plurality of auxiliary sub-pixels Pa may emit, for example, red light, green light, blue light, or white light. The component CA may be covered with an encapsulation member and thus may be protected from ambient air, moisture, or the like.

The component area CA may include the transmission area TA. The transmission area TA may be arranged to surround the plurality of auxiliary sub-pixels Pa. In some embodiments, however, the transmission area TA may be arranged in a lattice configuration with the plurality of auxiliary sub-pixels Pa.

Because the component area CA has the transmission areas TA, a resolution of the component area CA may be lower than a resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or greater, and the resolution of the component area CA may be about 200 ppi or about 100 ppi.

Pixel circuits that drive the main and auxiliary sub-pixels Pm and Pa may be electrically connected to outer circuits arranged in the peripheral area DPA, respectively. A first scan driving circuit SDRV1, a second scan driving circuit SDRV2, a terminal portion PAD, a driving voltage supply line 11, a common voltage supply line 13, and an initialization voltage supply line 15 may be arranged in the peripheral area DPA. In some embodiments, a bias voltage supply line 17 may be arranged in the peripheral area DPA, the bias voltage supply line 17 applying a bias voltage to the bottom metal layer BML.

The first scan driving circuit SDRV1 may apply a scan signal to each of the pixel circuits configured to drive the main and auxiliary sub-pixels Pm and Pa through a scan line SL. The first scan driving circuit SDRV1 may apply an emission control signal to each pixel circuit through an emission control line EL. The second scan driving circuit SDRV2 may be arranged on an opposite side of the first scan driving circuit SDRV1 in the peripheral area DPA, with the main display area MDA therebetween and may be approximately parallel to the first scan driving circuit SDRV1. Some of the pixel circuits of the main sub-pixels Pm in the main display area MDA may be electrically connected to the first scan driving circuit SDRV1, and the rest of the pixel circuits may be electrically connected to the second scan driving circuit SDRV2. Some of the pixel circuits of the auxiliary sub-pixels Pa in the component area CA may be electrically connected to the first scan driving circuit SDRV1, and the rest of the pixel circuits may be electrically connected to the second scan driving circuit SDRV2. In some embodiments, the second scan driving circuit SDRV2 may be omitted.

The terminal portion PAD may be arranged on one side of the substrate 100. The terminal portion PAD may be exposed by not being covered by an insulating layer and may be connected to a display circuit board 30. A display driver 32 may be arranged on the display circuit board 30.

The display driver 32 may generate a control signal transferred to the first scan driving circuit SDRV1 and the second scan driving circuit SDRV2. The display driver 32 generates a data signal. The generated data signal may be transferred to the pixel circuits of the main and auxiliary sub-pixels Pm and Pa through a fan-out line FW and the data line DL connected to the fan-out line FW.

The display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa through the driving voltage line PL connected to the driving voltage supply line 11, and the common voltage ELVSS may be applied to an opposite electrode of the display elements through the common voltage supply line 13.

The display driver 32 may supply an initialization voltage to the initialization voltage supply line 15. The initialization voltage may be applied to the pixel circuits of the main and auxiliary sub-pixels Pm and Pa through an initialization voltage line VL.

The display driver 32 may supply a bias voltage to the bias voltage supply line 17. The bias voltage may be applied to the bottom metal layer BML (see FIG. 2) through a bias line BW branching from the bias voltage supply line 17. The bias line BW may be formed at the same layer as the bias voltage supply line 17 and may be provided as one body (i.e., integrally formed with each other), or may be formed on a layer different from the bias voltage supply line 17 and may be connected through the bias voltage supply line 17 through a contact hole. In some embodiments, the bias line BW may extend in a negative (−) y-direction.

The bias voltage supply line 17 in the peripheral area DPA may neighbor the component area CA. As an example, in the case where the component area CA is arranged in a top side of the display area DA, the bias voltage supply line 17 may extend in an x-direction in the peripheral area DPA neighboring the top side of the display area DA. The bias voltage supply line 17 may be connected to the terminal portion PAD through a connection line 17a arranged in the peripheral area DPA and may receive a bias voltage supplied by the display driver 32.

The driving voltage supply line 11 may be connected to the terminal portion PAD and may extend in the x-direction in the bottom side of the main display area MDA. The common voltage supply line 13 may be connected to the terminal portion PAD and may have a loop shape having one open side to partially surround the main display area MDA along the periphery of the main display area MDA. The initialization voltage supply line 15 may be connected to the terminal portion PAD and may extend in the x-direction in the bottom side of the main display area MDA.

Figure 4:
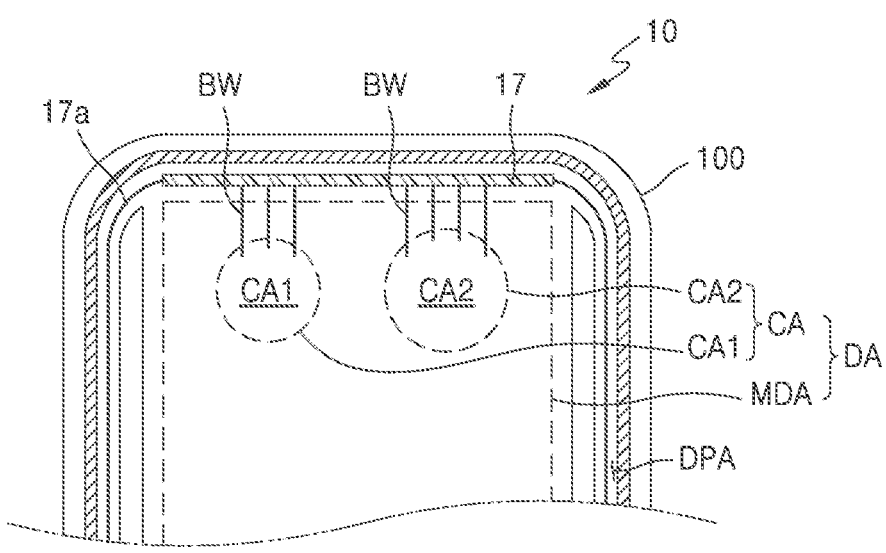
FIG. 4 is a plan view of a portion of a display panel according to one or more example embodiments.

FIG. 4 is a plan view of a portion of the display panel 10 according to one or more example embodiments.

Referring to FIG. 4, the component area CA may be provided in plural. The component area CA may include a first component area CA1 and a second component area CA2 parallel to each other in the x-direction. In this case, the first component area CA1 may be apart from the second component area CA2. Each of the first component area CA1 and the second component area CA2 may be surrounded by the main display area MDA.

The size of the first component area CA1 may be different from the size of the second component area CA2. In some embodiments, the shape of the first component area CA1 may be different from the shape of the second component area CA2.

The bias voltage supply line 17 may be arranged in the peripheral area DPA neighboring the first component area CA1 and the second component area CA2. The bias line BW may connect the bias voltage supply line 17 to a bottom metal layer BML arranged in the first component area CA1 and the second component area CA2.

Figure 5:
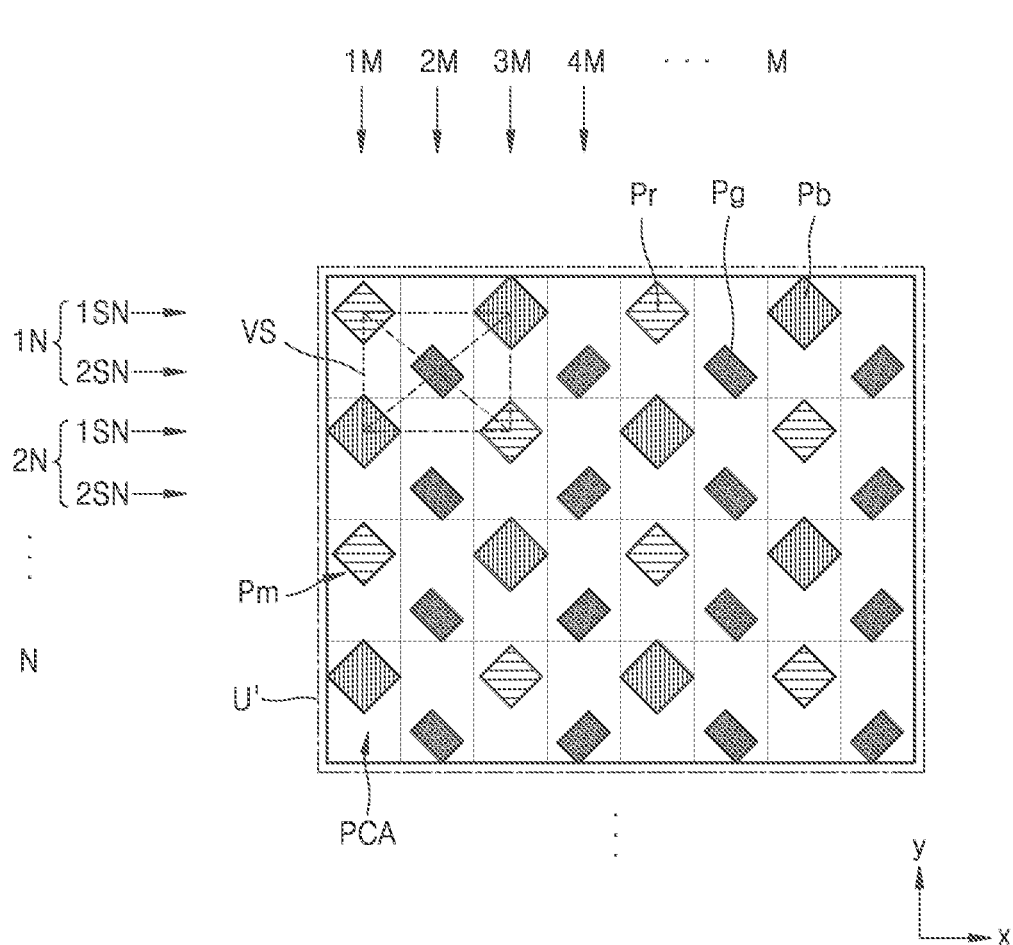
FIG. 5 is a view of a pixel arrangement structure in a main display area according to one or more example embodiments.

FIG. 5 is an arrangement view of a pixel arrangement structure in the main display area MDA according to one or more example embodiments.

Referring to FIG. 5, a plurality of main sub-pixels Pm may be arranged in the main display area MDA. In the present specification, a sub-pixel is a minimum unit displaying an image and may include an emission area. In the case where an organic light-emitting diode is employed as a display element, an emission area of a sub-pixel may be defined by an emission layer or an opening of a pixel-defining layer. This will be described later below.

In the main display area MDA of FIG. 5, regions partitioned by solid lines include pixel circuit areas PCA in which a pixel circuit is arranged. The pixel circuit may be connected to a main sub-pixel Pm.

Main sub-pixels Pm may include a red sub-pixel Pr, a green sub-pixels Pg, and a blue sub-pixel Pb. The red sub-pixel Pr, the green sub-pixel Pg, and the blue sub-pixel Pb may respectively display red, green, and blue colors.

Red sub-pixels Pr and blue sub-pixels Pb are alternately arranged on a first sub-row 1SN of each row N, and green sub-pixels Pg are apart from each other with a preset interval on a second sub-row 2SN neighboring the first sub-row 1SN. Such pixel arrangement may be repeated up to an N-th row. In this case, the blue sub-pixel Pb and the red sub-pixel Pr may be larger than the green sub-pixel Pg. The red sub-pixel Pr and the blue sub-pixel Pb on the first sub-row 1SN and the green sub-pixel Pg on the second sub-row 2SN may be alternately arranged. Therefore, the red sub-pixels Pr and the blue sub-pixels Pb are alternately arranged on a first column 1M, and the green sub-pixels Pg are apart from each other with a preset interval on a second column 2M neighboring the first column 1M. The blue sub-pixels Pb and the red sub-pixels Pr are alternately arranged on a third column 3M neighboring the second column 2M containing the green sub-pixels Pg, the green sub-pixels Pg are apart from each other with an interval (e.g., a preset interval) on a fourth column 4M neighboring the third column 3M. Such pixel arrangement may be repeated up to an M-th column.

Such pixel arrangement structure may be expressed, in which red sub-pixels Pr are respectively arranged on first and third vertexes from among the vertexes of a virtual quadrangle VS with a green sub-pixel Pg centered at the center of the virtual quadrangle VS, and blue sub-pixels Pb are respectively arranged on second and fourth vertexes of the virtual quadrangle VS, which are the rest of the vertexes. In this case, the virtual quadrangle VS may be variously modified to a rectangle, a rhombus, a square, etc.

This pixel arrangement structure may be referred to as an RGBG matrix structure (e.g., a PENTILE® matrix structure) or an RGBG structure (e.g., a PENTILE® structure). PENTILE® is a registered trademark of Samsung Display Co., Ltd., Republic of Korea. By applying rendering, in which a color of a pixel is represented by sharing the colors of its adjacent pixels, a high resolution may be obtained via a small number of pixels.

Though it is shown in FIG. 5 that a plurality of main sub-pixels Pm are arranged in a PENTILE® structure, the example embodiments are not limited thereto. In one or more example embodiments, a plurality of main sub-pixels Pm may be arranged in various configurations such as a stripe structure, a mosaic arrangement structure, and a delta arrangement structure.

Figure 6A:
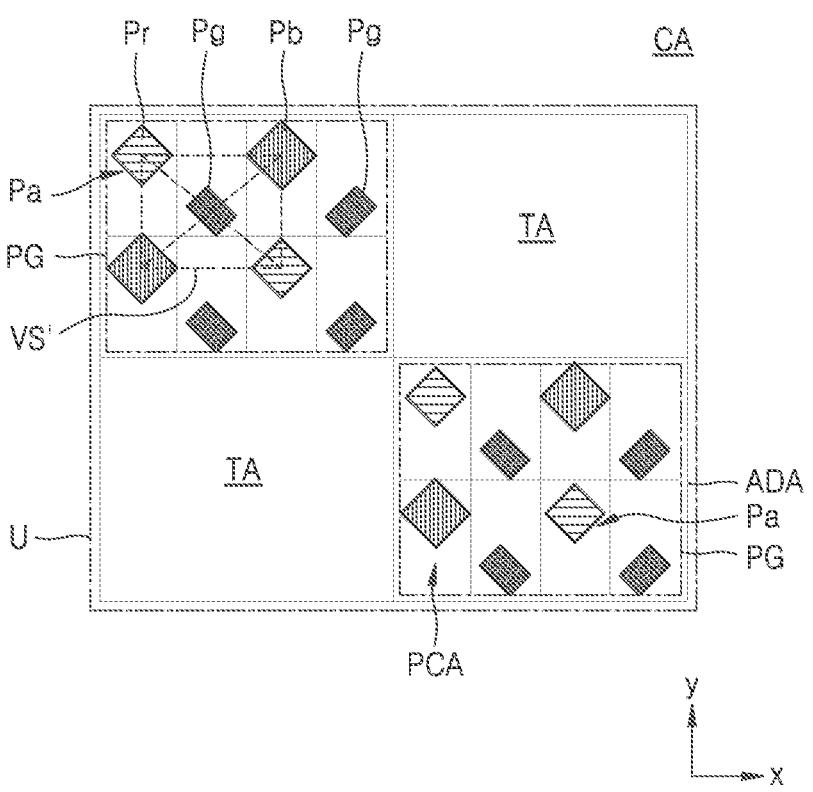
FIGS. 6A and 6B are views of a pixel arrangement structure in a component area according to one or more example embodiments.
Figure 6B:
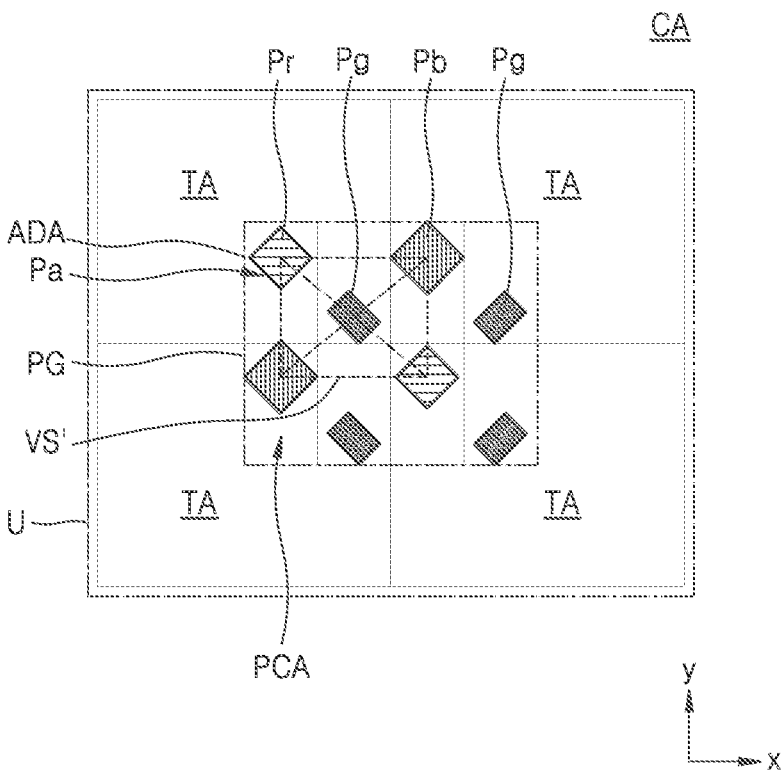

FIGS. 6A and 6B are arrangement views of a pixel arrangement structure in the component area CA according to one or more example embodiments.

Referring to FIG. 6A, a plurality of auxiliary sub-pixels Pa may be arranged in the component area CA. Each of the auxiliary sub-pixels Pa may emit light of any one of red, green, blue, and white colors.

The component area CA may include an auxiliary display area ADA and a transmission area TA, a pixel group PG including at least one auxiliary sub-pixel Pa being arranged in the auxiliary display area ADA. The auxiliary display areas ADA and the transmission areas TA may be alternately arranged in the x-direction and the y-direction and arranged, for example, in a lattice configuration. In this case, the component area CA may include a plurality of auxiliary display areas ADA and a plurality of transmission areas TA.

In the auxiliary display area ADA of FIG. 6A, regions partitioned by solid lines include pixel circuit areas PCA in which a pixel circuit connected to an auxiliary sub-pixel Pa is arranged.

The pixel group PG may be defined as a sub-pixel aggregation of the plurality of auxiliary sub-pixel Pa bound on a preset unit. For example, as in FIG. 6A, one pixel group PG may include eight auxiliary sub-pixels Pa arranged in a PENTILE® structure. For example, one pixel group PG may include two red sub-pixels Pr, four green sub-pixels Pg, and two blue sub-pixels Pb.

In the component area CA, a basic unit U may be repeatedly arranged in the x-direction and the y-direction, a preset number of pixel groups PG and a preset number of transmission areas TA being bound in the basic unit U. In FIG. 6A, the basic unit U may have a shape in which two pixel groups PG and two transmission areas TA are bound in a quadrangle. The basic unit U includes repeated shapes that are divided and does not mean disconnection of configuration.

As shown in FIG. 5, a corresponding unit U' may be set in the main display area MDA. The corresponding unit U' may have the same area as the area of the basic unit U. In this case, the number of main sub-pixels Pm included in the corresponding unit U' may be greater than the number of auxiliary sub-pixels Pa included in the basic unit U. For example, the number of auxiliary sub-pixels Pa included in the basic unit U is 16 and the number of main sub-pixels Pm included in the corresponding unit U' is 32. The number of auxiliary sub-pixels Pa and the number of main sub-pixels Pm per same area (e.g., U or U') may be provided at a ratio of 1:2.

Similar to the arrangement of the main sub-pixels Pm in the main display area MDA, four auxiliary sub-pixels Pa may be respectively arranged at the vertexes of a virtual quadrangle VS'. The resolution of the component area CA is ½ of the resolution of the main display area MDA. The pixel arrangement structure of the component area CA is called a ½ PENTILE® structure. The number of auxiliary sub-pixels Pa or the arrangement of the auxiliary sub-pixels Pa included in the pixel group PG may be modified depending on the resolution of the component area CA.

Referring to FIG. 6B, a pixel arrangement structure of the component area CA may include a ¼ PENTILE® structure. In the present embodiment, though 8 auxiliary sub-pixels Pa are arranged in a PENTILE® structure in the pixel group PG, the basic unit U may include only one pixel group PG. The rest of the regions of the basic unit U may be provided as the transmission areas TA. Therefore, the number of auxiliary sub-pixels Pa and the number of main sub-pixels Pm per same area (e.g., U and U') may be provided at a ratio of 1:4. In this case, one pixel group PG may be surrounded by the transmission areas TA.

Though it is shown in FIGS. 6A and 6B that a plurality of auxiliary sub-pixels Pa are arranged in a PENTILE® structure, the embodiment is not limited thereto. As an example, a plurality of auxiliary sub-pixels Pa may be arranged in various configurations such as a stripe structure, a mosaic arrangement structure, and a delta arrangement structure.

In addition, although it is shown in FIGS. 6A and 6B that the size of the auxiliary sub-pixel Pa is the same as the size of the main sub-pixel Pm of FIG. 5, the present disclosure is not limited thereto. The size of the auxiliary sub-pixel Pa may be greater than the size of the main sub-pixel Pm emitting the same color. For example, the size of the blue sub-pixel Pb, which is an auxiliary sub-pixel Pa, may be greater than the size of the blue sub-pixel Pb, which is a main sub-pixel Pm. The difference in the size may be designed by taking into account a difference in the brightness and/or the resolution between the component area CA and the main display area MDA.

Figure 7:
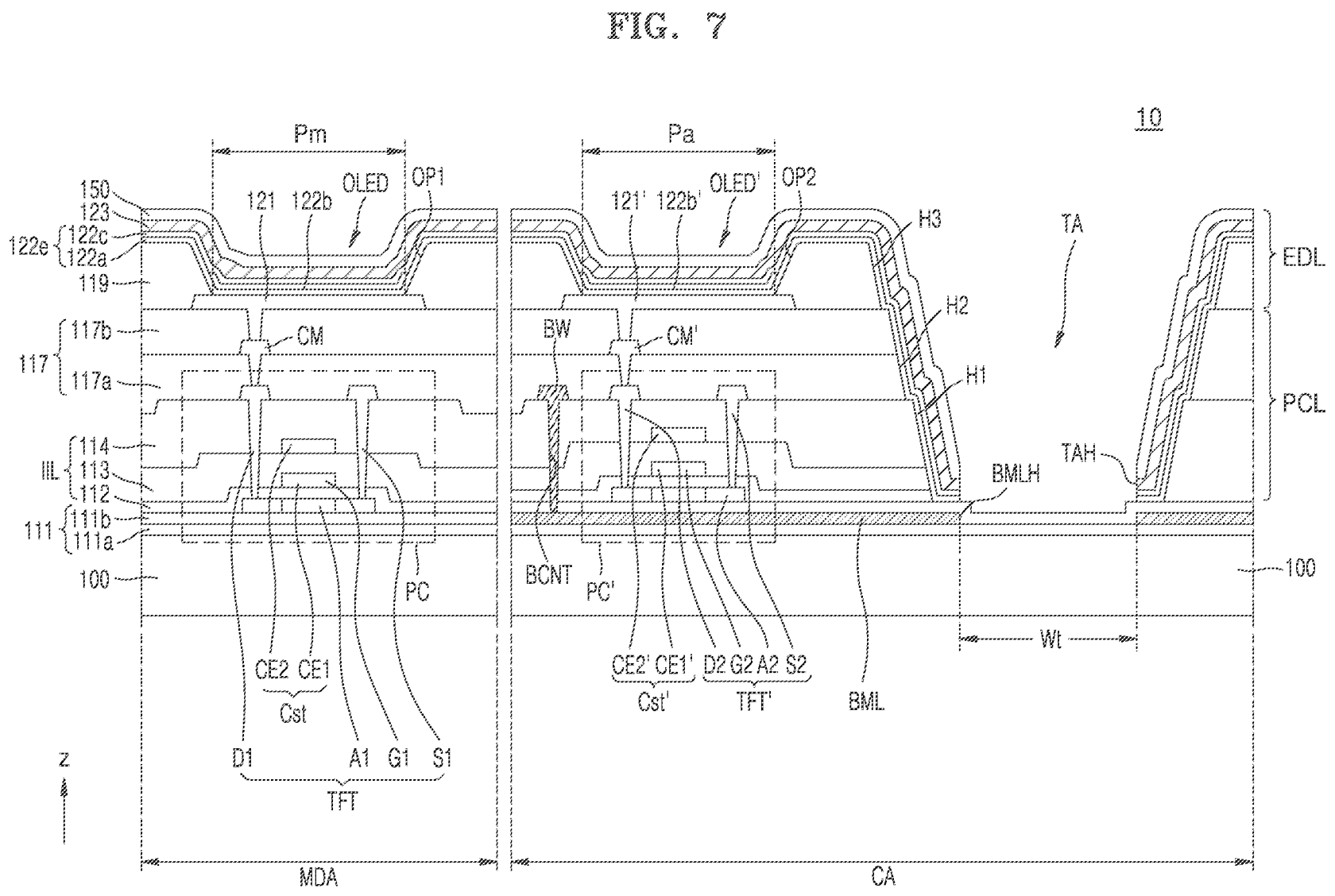

FIG. 7 is a cross-sectional view of a portion of the display panel 10 according to one or more example embodiments and cross-sectional view of the main display area MDA and the component area CA.

Referring to FIG. 7, the display panel 10 includes the main display area MDA and the component area CA. Main sub-pixels Pm are arranged in the main display area MDA, and auxiliary sub-pixels Pa and transmission areas TA are arranged in the component area CA. A main pixel circuit PC and a main organic light-emitting diode OLED, which is a display element, may be arranged in the main display area MDA, the main pixel circuit PC including a main thin film transistor TFT and a main capacitor Cst, and the main light-emitting diode OLED being connected to the main pixel circuit PC. An auxiliary pixel circuit PC' and an auxiliary organic light-emitting diode OLED', which is a display element, may be arranged in the component area CA, the auxiliary pixel circuit PC' including an auxiliary thin film transistor TFT' and an auxiliary capacitor Cst', and the auxiliary organic light-emitting diode OLED' being connected to the auxiliary pixel circuit PC'.

Though an organic light-emitting diode is employed as a display element as an example in the present embodiment, an inorganic light-emitting diode or a quantum-dot light-emitting diode may be employed as a display element in another embodiment.

A structure in which elements of the display panel 10 are stacked is described below. The display panel 10 may include the substrate 100, a buffer layer 111, the circuit layer PCL, and the display element layer EDL. As shown in FIG. 2, the sealing member ENCM and the optical functional layer OFL may be further stacked on the display element layer EDL.

The substrate 100 may include an insulative material, such as glass, quartz, and polymer resin. The substrate 100 may be a rigid substrate or a flexible substrate that is bendable, foldable, or rollable.

The buffer layer 111 may be positioned on the substrate 100 and may reduce or prevent infiltration of a foreign material, moisture, or ambient air from below the substrate 100 into the display panel 10 and may provide a flat surface on the substrate 100 (e.g., planarize the top surface of the substrate 100). The buffer layer 111 may include an inorganic material, such as an oxide or nitride, or an organic material, or an organic-inorganic composite material, and may have a single layer structure or a multilayer structure including an inorganic material or an organic material. A barrier layer (not shown) may be further included between the substrate 100 and the buffer layer 111 to block penetration of external air. In some embodiments, the buffer layer 111 may include silicon oxide ($SiO_x$) or silicon nitride ($SiN_x$). The buffer layer 111 may have a structure in which a first buffer layer 111a and a second buffer layer 111b are stacked.

In the component area CA, the bottom metal layer BML may be between the first buffer layer 111a and the second buffer layer 111b. In another embodiment, the bottom metal layer BML may be between the substrate 100 and the first buffer layer 111a. The bottom metal layer BML may be arranged below the auxiliary pixel circuit PC' and may prevent characteristics of the auxiliary thin-film transistor TFT' from degrading due to light emitted from, for example, a component. The bottom metal layer BML may prevent light (or substantially prevent) that is emitted from the component or the like or heads toward the component from being diffracted through a narrow gap between wires connected to the auxiliary pixel circuit PC'. There is no bottom metal layer BML in the transmission area TA.

In some embodiments, the bottom metal layer BML may be connected to the bias line BW arranged on a different layer through a contact hole BCNT. The bottom metal layer BML may receive a constant voltage or signal from the bias line BW. For example, the bottom metal layer BML may receive a bias voltage. A difference in the brightness between the component area CA and the main display area MDA depending on a process distribution may be adjusted by adjusting a bias voltage.

In some embodiments, as the bias voltage is applied to the bottom metal layer BML, the auxiliary thin film transistor TFT' may be implemented as a double-gate transistor including two gate electrodes facing each other with a semiconductor layer therebetween and thus the characteristic of the auxiliary thin film transistor TFT' may be adjusted.

The bias voltage may vary depending on a driving mode of the display device. For example, the bias voltage applied to the bias supply line 17 (see FIG. 3) may be different depending on the driving mode of the display device such as a high-brightness mode, a low-brightness mode (e.g., a low-power display mode in which a clock, a date, etc. are displayed), and a normal mode. Accordingly, the brightness of the component area CA may be adjusted for each driving mode.

The bottom metal layer BML may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). The bottom metal layer BML may be a single layer or multi-layer including the aforementioned materials.

The pixel circuit layer PCL may be arranged on the buffer layer 111 and may include the pixel circuits, for example, the main and auxiliary pixel circuits PC and PC', a first gate insulating layer 112, a second gate insulating layer 113, an interlayer insulating layer 114, and a planarization layer 117.

The main thin-film transistor TFT and/or the auxiliary thin-film transistor TFT' may be above the buffer layer 111. The main thin film transistor TFT includes a first semiconductor layer A1, a first gate electrode G1, a first source electrode S1, and a first drain electrode D1. The auxiliary thin film transistor TFT' may include a second semiconductor layer A2, a second gate electrode G2, a second source electrode S2, and a second drain electrode D2. The main thin-film transistor TFT may be connected to the main organic light-emitting diode OLED to drive the main organic light-emitting diode OLED. The auxiliary thin film transistor TFT' may be connected to the auxiliary organic light-emitting diode OLED' to drive the auxiliary organic light-emitting diode OLED'.

The first semiconductor layer A1 and the second semiconductor layer A2 may be arranged on the buffer layer 111 and may include polycrystalline silicon. In another embodiment, the first semiconductor layer A1 and the second semiconductor layer A2 may include amorphous silicon. According to another embodiment, the first and second semiconductor layers A1 and A2 may include oxide of at least one element selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may include a channel region, a source region, and a drain region, the source region and the drain region being doped with impurities.

The second semiconductor layer A2 may overlap the bottom metal layer BML with the second buffer layer 111b therebetween. In some embodiments, the width of the second semiconductor layer A2 may be less than the width of the bottom metal layer BML and accordingly, when projected in a direction perpendicular to the substrate 100, the second semiconductor layer A2 may entirely overlap the bottom metal layer BML.

The first gate insulating layer 112 may cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zinc peroxide ($ZnO_2$). The first gate insulating layer 112 may be a single layer or multi-layer including the aforementioned inorganic insulating materials.

The first gate electrode G1 and the second gate electrode G2 are arranged on the first gate insulating layer 112 to respectively overlap the first semiconductor layer A1 and the second semiconductor layer A2. The first gate electrode G1 and the second gate electrode G2 may include at least one of molybdenum (Mo), aluminum (Al), copper (Cu), and titanium (Ti) and include a single layer or a multi-layer. For example, the first gate electrode G1 and the second gate electrode G2 may include a single Mo layer.

The second gate insulating layer 113 may cover the first gate electrode G1 and the second gate electrode G2. The second gate insulating layer 113 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or multi-layer including the aforementioned inorganic insulating materials.

A first top electrode CE2 of the main capacitor Cst and a second top electrode CE2' of the auxiliary capacitor Cst' may be arranged on the second gate insulating layer 113.

The first top electrode CE2 may overlap the first gate electrode G1 therebelow in the main display area MDA. The first gate electrode G1 and the first top electrode CE2 overlapping each other with the second gate insulating layer 113 therebetween may constitute the main capacitor Cst. The first gate electrode G1 may serve as a first bottom electrode CE1 of the main capacitor Cst.

The second top electrode CE2' may overlap the second gate electrode G2 therebelow in the component area CA. The second gate electrode G2 and the second top electrode CE2' overlapping each other with the second gate insulating layer 113 therebetween may constitute the auxiliary capacitor Cst'. The second gate electrode G2 may serve as a second bottom electrode CE1' of the auxiliary capacitor Cst'.

The first top electrode CE2 and the second top electrode CE2' may include one or more of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and may include a single layer or a multi-layer including one or more of the above materials.

The interlayer insulating layer 114 may cover the first top electrode CE2 and the second top electrode CE2'. The interlayer insulating layer 114 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the above inorganic insulating material.

Assuming that the first gate insulating layer 112, the second gate insulating layer 113, and the interlayer insulating layer 114 are collectively referred to as an inorganic insulating layer IIL, the inorganic insulating layer IIL may include a first hole H1 corresponding to the transmission area TA. The first hole H1 may expose a portion of the top surface of the buffer layer 111 or the substrate 100. The first hole H1 may include an opening of the first gate insulating layer 112, an opening of the second gate insulating layer 113, and an opening of the interlayer insulating layer 114 each corresponding to the transmission area TA and overlapping one another. These openings may be individually formed through separate processes or may be simultaneously formed through the same process. When these openings are formed through separate processes, the inner surface of the first hole H1 may not be smooth and may have steps such as a staircase shape.

In some embodiments, the inorganic insulating layer IIL may include a groove, not the first hole H1 exposing the buffer layer 111. In some other embodiments, the inorganic insulating layer IIL may not have the first hole H1 or the groove corresponding to the transmission area TA. Because the inorganic insulating layer IIL includes an inorganic insulating material having an excellent light transmittance, even though the inorganic insulating layer IIL does not include a hole or groove corresponding to the transmission area TA, the component 40 (see FIG. 2) may transmit/receive a sufficient amount of light.

The first and second source electrodes S1 and S2 and the first and second drain electrodes D1 and D2 may be arranged on the interlayer insulating layer 114. The first and second source electrodes S1 and S2 and the first and second drain electrodes D1 and D2 may include a conductive material including molybdenum (Mo), aluminum (Al), copper (Cu), and titanium (Ti) and include a single layer or a multi-layer including the above materials. In some embodiments, the first and second source electrodes S1 and S2 and the first and second drain electrodes D1 and D2 may have a multi-layered structure of Ti/Al/Ti.

The planarization layer 117 may be arranged to cover the first and second source electrodes S1 and S2 and the first and second drain electrodes D1 and D2. The planarization layer 117 may have a flat top surface such that a first pixel electrode 121 and a second pixel electrode 121' that are located thereon are formed flat.

The planarization layer 117 may include an organic material or an inorganic material and may have a single layer structure or a multi-layer structure. The planarization layer 117 may include a first planarization layer 117*a* and a second planarization layer 117*b*. Accordingly, a conductive pattern such as a wire may be provided between the first planarization layer 117*a* and the second planarization layer 117*b*, and thus may be favorable to high integration.

The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or the like. The planarization layer 117 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is formed, a layer may be formed, and then chemical and mechanical polishing may be performed on the top surface of the layer to provide a flat top surface.

As shown in FIG. 7, the bias line BW may be arranged on the inorganic insulating layer IIL. In another embodiment, the bias line BW may be arranged between the first planarization layer 117*a* and the second planarization layer 117*b*. The bias line BW may be electrically connected to the bottom metal layer BML through a contact hole BCNT, the bottom metal layer BML being arranged in the component area CA.

The first planarization layer 117*a* may cover the main and auxiliary pixel circuits PC and PC'. The second planarization layer 117*b* may be arranged on the first planarization layer 117*a* and may have a flat top surface such that the first and second pixel electrodes 121 and 121' are formed flat.

First and second organic light-emitting diodes OLED and OLED' are arranged on the second planarization layer 117*b*. The first and second pixel electrodes 121 and 121' of the first and second organic light-emitting diodes OLED and OLED' may be respectively connected to the pixel circuits, that is, the main and auxiliary pixel circuits PC and PC' through connection electrodes CM and CM' on the planarization layer 117.

The connection electrodes CM and CM' may be arranged between the first planarization layer 117*a* and the second planarization layer 117*b*. The connection electrodes CM and CM' may include a conductive material including molybdenum (Mo), aluminum (Al), copper (Cu), and titanium (Ti) and include a single layer or a multi-layer including the above materials. For example, the connection electrodes CM and CM' may have a multi-layered structure of Ti/Al/Ti.

The planarization layer 117 may have a second hole H2 corresponding to the transmission area TA. The second hole H2 may overlap the first hole H1. It is shown in FIG. 7 that the second hole H2 is greater than the first hole H1. In another embodiment, the planarization layer 117 may cover the edges of the first hole H1 of the inorganic insulating layer IIL and accordingly, the area of the second hole H2 may be less than the area of the first hole H1.

The planarization layer 117 may have a via hole via which one of the first source electrode S1 and the first drain electrode D1 of the main thin-film-transistor TFT is exposed, and the first pixel electrode 121 may contact the first source electrode S1 or the first drain electrode D1 via the via hole and may be electrically connected to the main thin-film-transistor TFT. The planarization layer 117 may include another via hole via which one of the second source electrode S2 and the second drain electrode D2 of the auxiliary thin-film-transistor TFT' is exposed, and the second pixel electrode 121' may contact the second source electrode S2 or the second drain electrode D2 via the other via hole and may be electrically connected to the auxiliary thin-film-transistor TFT'.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chrome (Cr), or compound thereof. For example, each of the first and second pixel electrodes 121 and 121' may have a structure including layers including ITO, IZO, ZnO, or $In_2O_3$ above/below the aforementioned reflection layer. In this case, each of the first and second pixel electrodes 121 and 121' may have a stack structure of ITO/Ag/ITO.

A pixel-defining layer 119 covers the edges of the first pixel electrode 121 and the second pixel electrode 121' on the planarization layer 117 and may include a first opening OP1 and a second opening OP2 respectively exposing the central portions of the first pixel electrode 121 and the second pixel electrode 121'. The sizes and shapes of emission areas of the first and second organic light-emitting diodes OLED and OLED', that is, the sizes and shapes of the main and auxiliary sub-pixels Pm and Pa are defined by the first opening OP1 and the second opening OP2.

The pixel-defining layer 119 may prevent an arc, etc. from occurring at the edges of the first pixel electrode 121 and the second pixel electrode 121' by increasing a distance between the edges of the first pixel electrode 121 and the second pixel electrode 121' and an opposite electrode 123 over the first pixel electrode 121 and the second pixel electrode 121'. The pixel-defining layer 119 may include an organic insulating material such as PI, polyamide, acrylic resin, BCB, HMDSO, and phenolic resin, and may be formed by spin coating.

The pixel-defining layer 119 may include a third hole H3 arranged in the transmission area TA. The third hole H3 may overlap the first hole H1 and the second hole H2. Due to the first through third holes H1 through H3, the light transmittance in the transmission area TA may improve. Though it is shown in FIG. 7 that the buffer layer 111 is continuously arranged to correspond to the transmission area TA, the buffer layer 111 may include a hole located in the transmission area TA. A portion of the opposite electrode 123 described below may be arranged on the inner surfaces of the first to third holes H1, H2, and H3.

A first emission layer 122*b* and a second emission layer 122*b*' are arranged inside the first opening OP1 and the second opening OP2 of the pixel-defining layer 119, the first emission layer 122*b* and the second emission layer 122*b*' respectively corresponding to the first pixel electrode 121 and the second pixel electrode 121'. The first emission layer 122*b* and the second emission layer 122*b*' may include a high molecular weight material or a low molecular weight material, and may emit red, green, blue, or white light.

An organic functional layer 122*e* may be arranged on and/or under the first emission layer 122*b* and the second emission layer 122*b*'. The organic functional layer 122*e* may include a first functional layer 122*a* and/or a second functional layer 122*c*. In some other embodiments, the first functional layer 122*a* and/or the second functional layer 122*c* may be omitted.

The first functional layer 122a may be arranged under the first emission layer 122b and the second emission layer 122b'. The first functional layer 122a may include a single layer or a multi-layer including an organic material. The first functional layer 122a may be a hole transport layer (HTL) that is a single layer. In some other embodiments, the first functional layer 122a may include a hole injection layer (HIL) and an HTL. The first functional layer 122a may be integrally provided to correspond to the main and auxiliary organic light-emitting diodes OLED and OLED' included in the main display area MDA and the component area CA.

The second functional layer 122c may be arranged on the first emission layer 122b and the second emission layer 122b'. The second functional layer 122c may include a single layer or a multi-layer including an organic material. The second functional layer 122c may include an electron transport layer (ETL) and/or an electron injection layer (EIL). The second functional layer 122c may be integrally provided to correspond to the main and auxiliary organic light-emitting diodes OLED and OLED' included in the main display area MDA and the component area CA.

The opposite electrode 123 is above the second functional layer 122c. The opposite electrode 123 may include a conductive material having a low work function. For example, the opposite electrode 123 may include a (semi) transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. In some other embodiments, the opposite electrode 123 may further include a layer, such as ITO, IZO, ZnO, or $In_2O_3$, on the (semi) transparent layer including any of the above-described materials. The opposite electrode 123 may be formed as one body to correspond to the main and auxiliary organic light-emitting diodes OLED and OLED' in the main display area MDA and the component area CA.

The layers from the first pixel electrode 121 to the opposite electrode 123 formed in the main display area MDA may constitute the main organic light-emitting diode OLED. The layers from the first pixel electrode 121' to the opposite electrode 123 formed in the component area CA may constitute the auxiliary organic light-emitting diode OLED'.

A top layer 150 may be formed on the opposite electrode 123. The top layer 150 may include an organic material. The top layer 150 may be provided to protect the opposite electrode 123 and to increase the light extraction efficiency. The top layer 150 may include an organic material having a higher refractive index than the opposite electrode 123. In some other embodiments, the top layer 150 may include the stack of layers having different refractive indexes. For example, the top layer 150 may include the stack of a high refractive index layer and/or a low refractive index layer and/or a high refractive index layer. In this case, a refractive index of the high refractive index layer may be about 1.7 or more, and a refractive index of the low refractive index layer may be about 1.3 or less.

The upper layer 150 may additionally include lithium fluoride (LiF). In some other embodiments, the top layer 150 may additionally include an inorganic insulating material such as silicon oxide ($SiO_2$) and silicon nitride ($SiN_x$).

The first functional layer 122a, the second functional layer 122c, the opposite electrode 123, and the top layer 150 may each include a transmission hole TAH corresponding to the transmission area TA. That is, each of the first functional layer 122a, the second functional layer 122c, the opposite electrode 123, and the top layer 150 may have an opening corresponding to the transmission area TA. These openings may have substantially the same area. For example, the area of the opening of the opposite electrode 123 may be substantially the same as the area of the transmission hole TAH.

When the transmission hole TAH corresponds to the transmission area TA, it may be understood that the transmission hole TAH overlaps the transmission area TA. In this case, the area of the transmission hole TAH may be less than the area of the first hole H1 formed in the inorganic insulating layer IL. For this, it is shown in FIG. 7 that a width Wt of the transmission hole TAH is less than the width of the first hole H1. Here, the area of the transmission hole TAH may be defined as the area of an opening having a smallest area from among the openings constituting the transmission hole TAH. The area of the first hole H1 may be defined as the area of an opening having a smallest area from among the openings constituting the first hole H1.

A portion of the opposite electrode 123 is removed from the transmission area TA due to the transmission hole TAH. Through this configuration, a light transmittance of the transmission area TA may be improved (e.g., significantly improved). The opposite electrode 123 including the transmission hole TAH may be formed through various methods. According to some embodiments, after a material used to form the opposite electrode 123 is deposited on the entire surface of the substrate 100, a portion of the deposited material that corresponds to the transmission area TA is removed via laser lift off, and thus the opposite electrode 123 having the transmission hole TAH may be formed. According to another embodiment, the opposite electrode 123 having the transmission hole TAH may be formed by metal self-patterning (MSP). In another embodiment, the opposite electrode 123 having the transmission hole TAH may be formed through a method of depositing the opposite electrode 123 using a fine metal mask (FMM).

The bottom metal layer BML of the component area CA may correspond to the entire component area CA. In this case, the bottom metal layer BML may include a bottom hole BMLH overlapping the transmission area TA. In some embodiments, the shape and size of the transmission area TA may be defined by the shape and size of the bottom hole BMLH.

In some embodiments, the bottom metal layer BML may not be arranged in the main display area MDA. In the case where the bottom metal layer BML is provided over the entire surface of the substrate 100 or a considerable portion of the substrate 100, a defect may occur during a process of crystallizing the semiconductor layer A1 of the thin film transistor TFT by using a laser.

In the present embodiment, because the bottom metal layer BML is arranged to correspond to only the component area CA, a defect rate in the process may be reduced.

Figure 8:
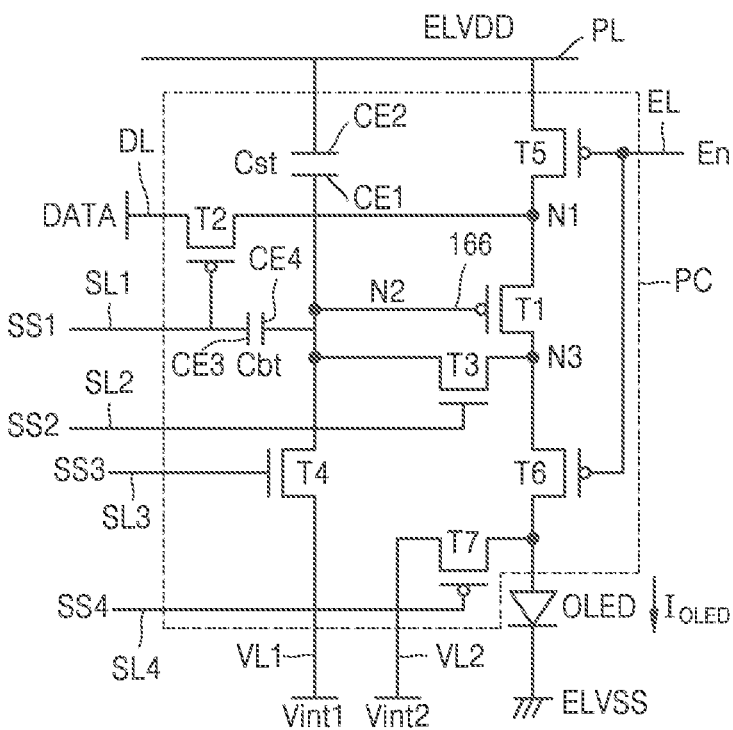
FIG. 8 is an equivalent circuit diagram of a pixel circuit configured to drive a sub-pixel according to one or more example embodiments.

FIG. 8 is an equivalent circuit diagram of a pixel circuit configured to drive a sub-pixel according to one or more example embodiments.

The pixel circuit shown in FIG. 8 shows the pixel circuit PC of the main sub-pixel Pm.

The pixel circuit PC may include first to seventh transistors T1, T2, T3, T4, T5, T6, and T7 and a first capacitor Cst and a second capacitor Cbt. The pixel circuit PC may be connected to a data line DL, a first scan line SL1, a second scan line SL2, a third scan line SL3, a fourth scan line SL4, and an emission control line EL. In some embodiments, the pixel circuit PC may be connected to first and second initialization voltage lines VL1 and VL2 and a driving voltage line PL. The pixel circuit PC may be connected to an organic light-emitting diode OLED as a display element.

The driving voltage line PL may transfer the driving voltage ELVDD to the first transistor T1. The first initialization voltage line VL1 may transfer a first initialization voltage Vint1 initializing the first transistor T1. The second initialization voltage line VL2 may transfer a second initialization voltage Vint2 initializing the organic light-emitting diode OLED.

It is shown in FIG. 8 that the third transistor T3 and the fourth transistor T4 from among the first to seventh transistors T1, T2, T3, T4, T5, T6, and T7 are implemented as n-channel metal oxide semiconductor field effect transistors (NMOS) and the rest of the transistors are implemented as p-channel metal oxide semiconductor field effect transistors (PMOS).

The first transistor T1 is connected between a first node N1 and a third node N3. The first transistor T1 is connected to the driving voltage line PL through the first node N1 and the fifth transistor T5 and may be electrically connected to the organic light-emitting diode OLED through the third node N3 and the sixth transistor T6. A gate electrode of the first transistor T1 is connected to the second node N2. The first transistor T1 serves as a driving transistor, receives a data signal DATA from the data line DL via the second transistor T2 and the first node N1, according to a switching operation of the second transistor T2, and supplies a driving current IOLED to the organic light-emitting diode OLED via the third node N3 and the sixth transistor T6. A gate electrode of the first transistor may be connected to a second node N2.

The second transistor T2 (e.g., a switching transistor) is connected between the data line DL and the first node N1. The second transistor T2 is connected to the power voltage line PL through the first node N1 and the fifth transistor T5. A gate electrode of the second transistor T2 is connected to the first scan line SL1. The second transistor T2 is turned on in response to a first scan signal SS1 having a gate on voltage (e.g., a low level voltage) being transferred through the first scan line SL1 to the gate electrode of the second transistor T2 and performs a switching operation of transferring a data signal DATA transferred through the data line DL to the first node N1.

The third transistor T3 (e.g., a compensation transistor) is connected between the second node N2 and the third node N3. The third transistor T3 is connected to the organic light-emitting diode OLED through the third node N3 and the sixth transistor T6. A gate electrode of the third transistor T3 is connected to a second scan line SL2. The third transistor T3 is turned on according to a second scan signal SS2 having a gate on voltage (e.g., a high level voltage) being transferred through the second scan line SL2 to the gate electrode of the third transistor T3 and diode-connects the first transistor T1. The third transistor T3 compensates a threshold voltage of the first transistor T1. The second scan signal SS2 may include an inverted signal of a first scan signal SS1. The second scan signal SS2 may be applied at the same timing as the first scan signal SS1.

The fourth transistor T4 (e.g., a first initialization transistor) is connected between the second node N2 and the first initialization voltage line VL1. A gate electrode of the fourth transistor T4 is connected to a third scan line SL3. The fourth transistor T4 is turned on in response to a third scan signal SS3 having a gate on voltage (e.g., a high level voltage) being transferred through the third scan line SL3 to the gate electrode of the fourth transistor T4 and initializes the voltage of the gate electrode of the first transistor T1 by transferring the first initialization voltage Vint1 to the gate electrode of the first transistor T1. The first initialization voltage Vint1 is from the first initialization voltage line VL1. A third scan signal SS3 may be applied at a timing prior to a first scan signal SS1.

The fifth transistor T5 (e.g., a first emission control transistor) is connected between the driving voltage line PL and the first node N1. The sixth transistor T6 (e.g., a second emission control transistor) is connected between the third node N3 and the organic light-emitting diode OLED. A gate electrode of each of the fifth transistor T5 and the sixth transistor T6 is connected to the emission control line EL, and the fifth transistor T5 and the sixth transistor T6 are concurrently (e.g., simultaneously) turned on in response to an emission control signal EM having a gate on voltage (e.g., a low level voltage) and form a current path such that the driving current IOLED flows from the driving voltage line PL to the organic light-emitting diode OLED.

A seventh transistor T7 (e.g., a second initialization transistor) is connected between the organic light-emitting diode OLED and the second initialization voltage line VL2. A gate electrode of the seventh transistor T7 is connected to the fourth scan line SL4. The seventh transistor T7 is turned on in response to a fourth scan signal SS4 having a gate on voltage (e.g., a low level voltage) being transferred through the fourth scan line SL4 to the gate electrode of the seventh transistor T7 and initializes the organic light-emitting diode OLED by transferring the second initialization voltage Vint2 to the organic light-emitting diode OLED. The second initialization voltage Vint2 is from the second initialization voltage line VL2. A fourth scan signal SS4 may be applied at a timing prior to a first scan signal SS1 or applied at a timing later than a first scan signal SS1. The seventh transistor T7 may be omitted.

The first capacitor Cst includes a first electrode CE1 and a second electrode CE2. The first electrode CE1 is connected to the gate electrode of the first transistor T1 via the second node N2, and the second electrode CE2 is connected to the driving voltage line PL. The first capacitor Cst serves as a storage capacitor and may maintain a voltage applied to the gate electrode of the first transistor T1 by storing and maintaining a voltage corresponding to a voltage difference between two opposite ends of the driving voltage line PL and the gate electrode of the first transistor T1.

The second capacitor Cbt includes a third electrode CE3 and a fourth electrode CE4. The third electrode CE3 is connected to the first scan line SL1 and the gate electrode of the second transistor T2. The fourth electrode CE4 is connected to the gate electrode of the first transistor T1 via the second node N2 and the first electrode CE1 of the first capacitor Cst. The second capacitor Cbt serves as a boosting capacitor. In the case where a first scan signal SS1 of the first scan line SL1 is a voltage that turns off the second transistor T2 (e.g., when the first scan signal SS1 has a high level voltage), the second capacitor Cbt may reduce a voltage (e.g., a black voltage) for displaying black by raising the voltage of the second node N2.

The organic light-emitting diode OLED includes a pixel electrode and an opposite electrode. The opposite electrode may receive a common voltage ELVSS. The organic light-emitting diode OLED displays an image by receiving the driving current IOLED from the first transistor T1 and emitting light corresponding to the driving current IOLED.

The pixel circuit PC is not limited to the number of transistors, the number of capacitors, and the circuit design described with reference to FIG. 8 and may be variously modified. The auxiliary pixel circuit PC' configured to drive the auxiliary sub-pixel Pa may be the same as or different from the main pixel circuit PC of the main sub-pixel Pm.

Figure 9:
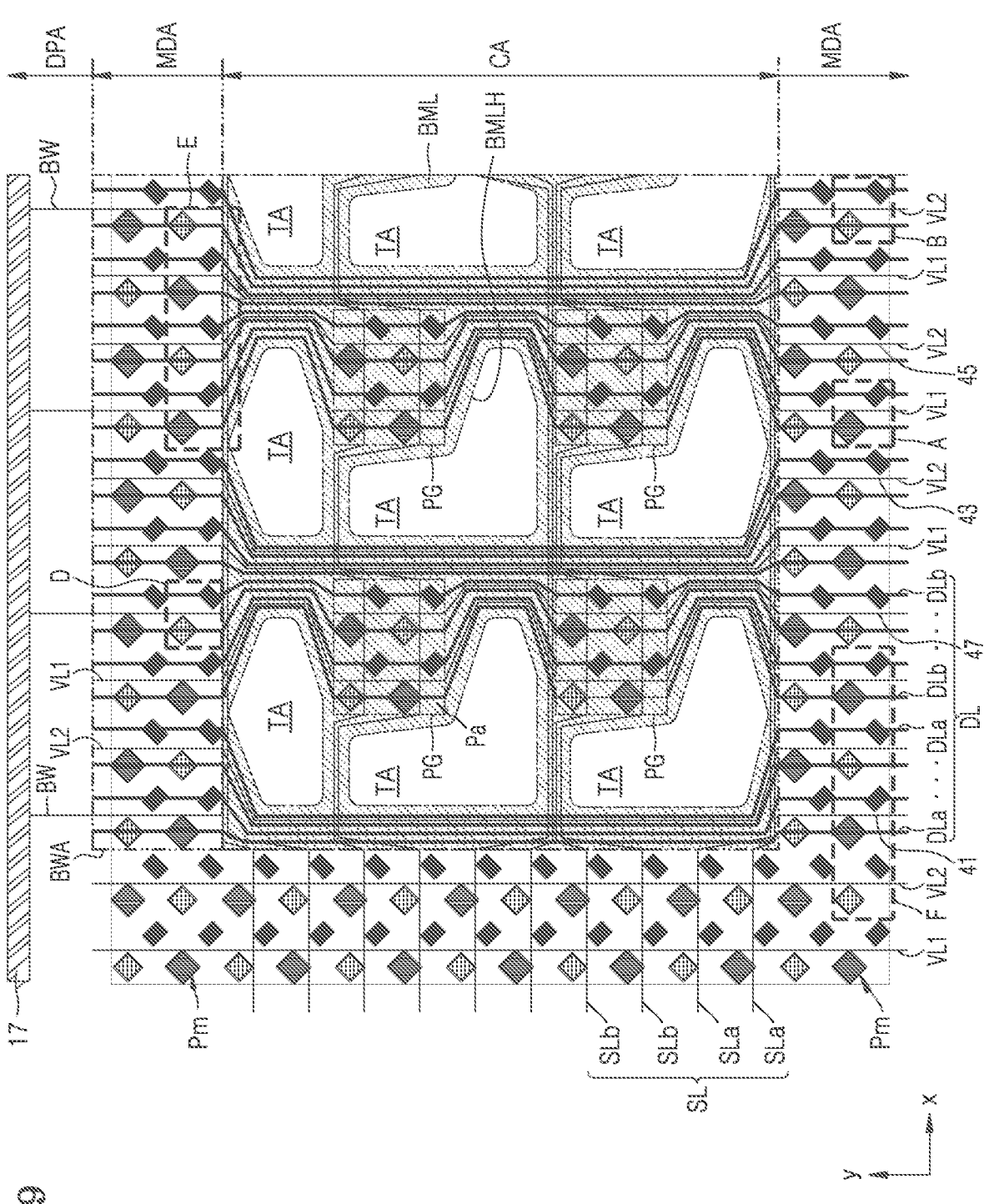
FIG. 9 is a plan view of arrangement relationships of sub-pixels, some wirings, and a bottom metal layer of a display panel according to one or more example embodiments.

FIG. 9 is a plan view of arrangement relations of sub-pixels, some of wirings, the bottom metal layer BML of the display panel 10 according to one or more example embodiments. FIG. 9 shows a portion of the component area CA and a portion of the main display area MDA outside the component area CA. Though FIG. 9 shows only wirings required for description, more wirings may be omitted.

Referring to FIG. 9, the scan line SL may extend in the x-direction and transfer a scan signal to the main pixel circuits of the main sub-pixels Pm and the auxiliary pixel circuits of the auxiliary sub-pixels Pa. The data line DL may extend in the y-direction crossing the scanline SL and may transfer a data signal to the main pixel circuits of the main sub-pixels Pm and the auxiliary pixel circuits of the auxiliary sub-pixels Pa.

The first initialization voltage line VL1 may include a first vertical voltage line and a first horizontal voltage line arranged at different layers, the first vertical voltage line and the first horizontal voltage line respectively extending in the y-direction and the x-direction. The second initialization voltage line VL2 may include a second vertical voltage line and a second horizontal voltage line arranged at different layers, the second vertical voltage line and the second horizontal voltage line respectively extending in the y-direction and the x-direction (see, for example, FIG. 17). The first vertical voltage line and the first horizontal voltage line may be electrically connected to each other in an crossing region or around the crossing region. The second vertical voltage line and the second horizontal voltage line may be electrically connected to each other in an crossing region or around the crossing region. The first initialization voltage line VL1 and the second initialization voltage line VL2 shown in FIG. 9 may respectively be the first vertical voltage line and the second vertical voltage line.

The first initialization voltage line VL1 may transfer the first initialization voltage (e.g., Vint1) to the main pixel circuits of the main sub-pixels Pm and the auxiliary pixel circuits of the auxiliary sub-pixels Pa. The second initialization voltage line VL2 may transfer the second initialization voltage (e.g., Vint2) to the main pixel circuits of the main sub-pixels Pm and the auxiliary pixel circuits of the auxiliary sub-pixels Pa. The first initialization voltage line VL1 and the second initialization voltage line VL2 may be alternately arranged in the x-direction.

Some of the first initialization voltage line VL1 and the second initialization voltage line VL2 (e.g., initialization voltage line 41) may be disconnected around the component area CA and may not pass through the component area CA. Some of the first initialization voltage line VL1 and the second initialization voltage line VL2 (e.g., initialization voltage line 43) may be electrically connected to the main pixel circuits of the main sub-pixels Pm arranged on the same column inside the main display area MDA arranged below the component area CA, and may be electrically connected to the main pixel circuits of the main sub-pixels Pm arranged on the same column inside the main display area MDA arranged over the component area CA across the transmission area TA. Some of the first initialization voltage line VL1 and the second initialization voltage line VL2 (e.g., initialization voltage line 45) may be electrically connected to the main pixel circuits of the main sub-pixels Pm and the auxiliary pixel circuits of the auxiliary sub-pixels Pa arranged on the same column inside the main display area MDA and the component area CA. Some of the first initialization voltage line VL1 and the second initialization voltage line VL2 (e.g., initialization voltage line 47) may be electrically connected to the main pixel circuits of the main sub-pixels Pm and the auxiliary pixel circuits of the auxiliary sub-pixels Pa arranged on the same column inside the main display area MDA and the component area CA, and may not be connected to the main pixel circuits of the main sub-pixels Pm arranged on the same column inside the main display area MDA on the top side.

The scan lines SL may include scan lines SLa and scan lines SLb. The scan lines SLa may extend in the x-direction and may be electrically connected to the main pixel circuits of the main sub-pixels Pm arranged on the same row inside the main display area MDA and may be arranged across the transmission area TA without being connected to the auxiliary pixel circuit of the auxiliary sub-pixel Pa. The scan lines SLb may extend in the x-direction and may be electrically connected to the main pixel circuits of the main sub-pixels Pm and the auxiliary pixel circuits of the auxiliary sub-pixels Pa arranged on the same row inside the main display area MDA and the component area CA. Each of the scan lines SLa and SLb includes the first to fourth scan lines SL1, SL2, SL3, and SL4 and is shown as one scan line, for convenience of description.

The data lines DL may include data lines DLa and data lines DLb. The data lines DLa may extend in the approximately y-direction and may be electrically connected to the main pixel circuits of the main sub-pixels Pm arranged on the same column inside the main display area MDA arranged below the component area CA, and may be electrically connected to the main pixel circuits of the main sub-pixels Pm arranged on the same column inside the main display area MDA arranged over the component area CA across the transmission area TA of the component area CA. The data lines DLb may extend in the y-direction and be electrically connected to the main pixel circuits of the main sub-pixels Pm and the auxiliary pixel circuits of the auxiliary sub-pixels Pa arranged on the same column inside the main display area MDA and the component area CA. The data line DL may be arranged on a layer different from the scan line SL.

Although it is shown in FIG. 9 that the scan lines SL and the data lines DL are continuously provided in the main display area MDA and the component area CA, the scan lines SL and the data lines DL may be connected to bridge lines arranged on a different layer in a partial region.

As shown in FIG. 9, to increase a light transmittance, the first and second initialization voltage lines VL1 and VL2, the scan lines SL, and the data lines DL arranged in the component area CA may not be arranged on the central portion of the transmission area TA but be arranged to be biased on one side. For this, the scan lines SL and the data lines DL arranged in the component area CA may be appropriately bent. Accordingly, an interval of the scan lines SL passing between the pixel groups PG that are apart from each other may be less than an interval of the scan lines SL passing through the sub-pixel inside the pixel group PG. In addition, an interval of the data lines DL passing between the pixel groups PG that are apart from each other may be less than an interval of the data lines DL passing through the sub-pixel inside the pixel group PG.

In some embodiments, the data lines DLa arranged between the pixel groups PG that are apart from each other may be biased on the left, and the data lines DLb may be biased on the right. In some embodiments, the scan lines SLa arranged between the pixel groups PG that are apart from each other may be biased on the bottom side, and the scan lines SLb may be biased on the top side. In some embodiments, some of the first and second initialization voltage lines VL1 and VL2 arranged between the pixel groups PG that are apart from each other may be biased on the left, and some of the first and second initialization voltage lines VL1 and VL2 may be biased on the right.

According to the wiring arrangement structure, a light transmittance of the transmission area TA and a light transmittance of the entire component area CA may improve. When an interval of wirings arranged in the component area CA narrows, diffraction of light may occur. Accordingly, the bottom metal layer BML may be arranged to overlap the wirings arranged in the component area CA.

The bottom metal layer BML may be arranged to correspond the entire component area CA and may include the bottom hole BMLH corresponding to the transmission area TA. The bottom metal layer BML may not be arranged in the main display area MDA.

The bottom metal layer BML may be connected to the bias voltage supply line 17 arranged in the peripheral area DPA through the bias line BW. The bias line BW may be connected to an edge portion of the bottom metal layer BML through a contact hole BCNT (e.g., as shown in FIG. 7).

The main display area MDA may be divided into a first area BWA and a second area excluding the first area BWA depending on whether the bias line BW is arranged. The first area BWA includes a region between the bias voltage supply line 17 and the component area CA, the region including a partial region of the main display area MDA in which the bias line BW is arranged. The second area includes a partial region of the main display area MDA in which the bias line BW is not arranged.

The first initialization voltage line VL1 and the second initialization voltage line VL2 arranged in the first area BWA may be respectively connected to the first initialization voltage line VL1 and the second initialization voltage line VL2 arranged in the second area. For example, the first initialization voltage line VL1 arranged in the first area BWA extends to the second area through the component area CA and accordingly, the first initialization voltage line VL1 arranged in the first area BWA and the first initialization voltage line VL1 arranged in the second area may be an integrated wiring. Likewise, the second initialization voltage line VL2 arranged in the first area BWA extends to the second area through the component area CA and accordingly, the second initialization voltage line VL2 arranged in the first area BWA and the second initialization voltage line VL2 arranged in the second area may be an integrated wiring.

Figure 10:
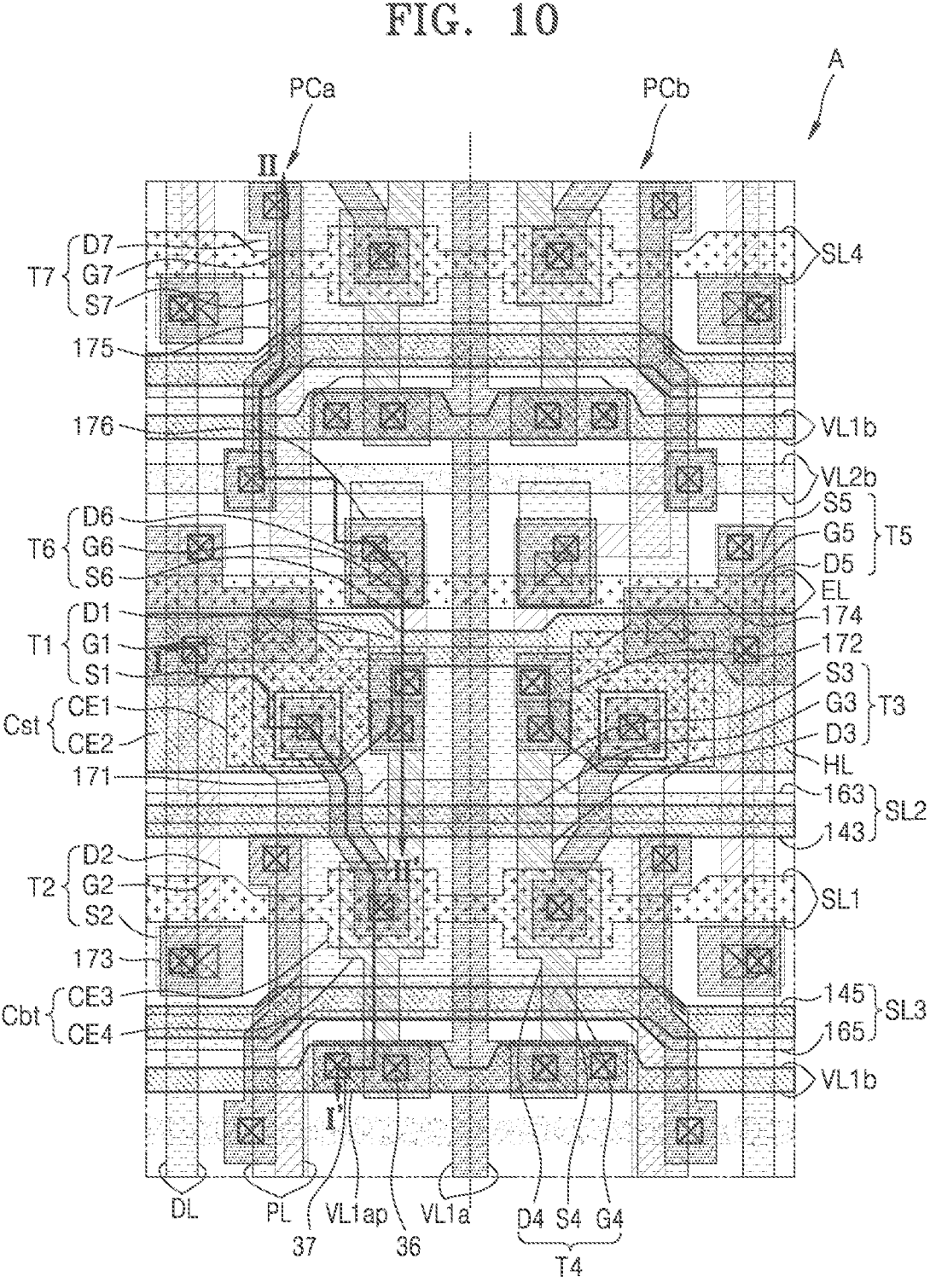
FIG. 10 is an enlarged plan view of pixel circuits arranged in a region A of FIG. 9.
Figure 11:
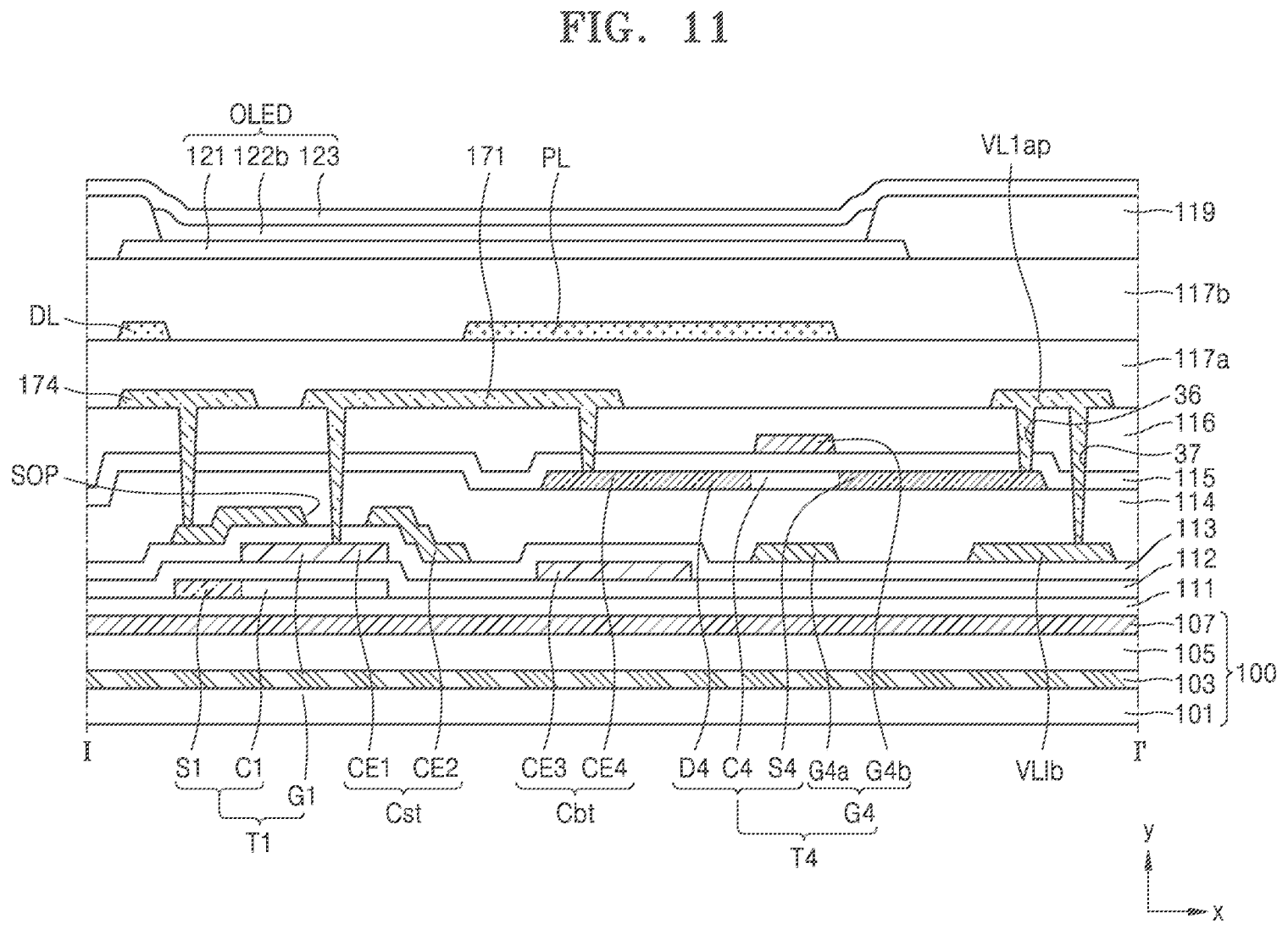
Figure 12:
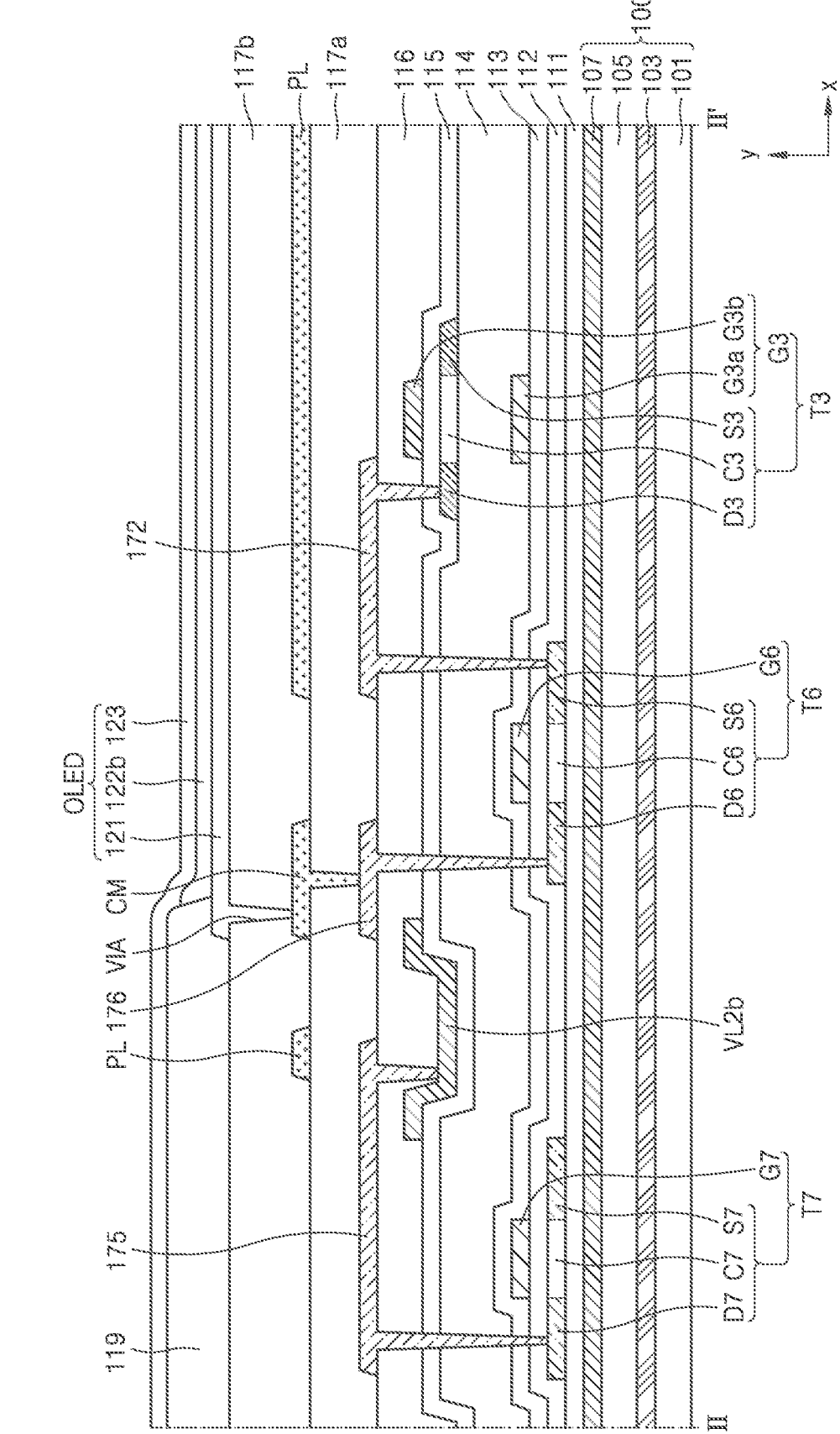
FIG. 12 is a cross-sectional view of the pixel circuit taken along the line II-II' of FIG. 10.

FIG. 10 is an enlarged plan view of pixel circuits arranged in a region A of FIG. 9. FIG. 11 is a cross-sectional view of the pixel circuit taken along the line I-I' of FIG. 10. FIG. 12 is a cross-sectional view of the pixel circuit taken along the line II-II' of FIG. 10. Hereinafter, detailed descriptions of the same elements as those of FIG. 7 are omitted.

FIG. 10 shows a pair of pixel circuits arranged on the same row of a neighboring column in the main display area MDA. FIG. 10 shows the pixel circuits arranged in a portion of the second area of the main display area MDA. A left pixel circuit PCa and a right pixel circuit PCb shown in FIG. 10 have a vertically symmetric structure (e.g., vertical line symmetry).

The pixel circuit may be connected to the first scan line SL1, the second scan line SL2, the third scan line SL3, the fourth scan line SL4, the emission control line EL, a first horizontal voltage line VL1b of the first initialization voltage line VL1, and a second horizontal voltage line VL2b of the second initialization voltage line VL2 each extending in the x-direction. In some embodiments, the pixel circuit may be connected to the data line DL, the driving voltage line PL, and a first vertical voltage line VL1a of the first initialization voltage line VL1.

The pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

In some embodiments, the first transistor T1, the second transistor T2, the fifth transistor T5, the sixth transistor T6, and the seventh transistor T7 may include thin film transistors including a silicon semiconductor. The third transistor T3 and the fourth transistor T4 may include thin film transistors including an oxide semiconductor. Hereinafter, the first to seventh transistors T1, T2, T3, T4, T5, T6, and T7 are denoted by the first to seventh thin film transistors T1, T2, T3, T4, T5, T6, and T7.

A first semiconductor layer may be arranged over the substrate 100. The first semiconductor layer may include a silicon semiconductor. As another example, the buffer layer 111 may be formed on the substrate 100, and the first semiconductor layer may be formed on the buffer layer 111. As shown in FIG. 7, the buffer layer 111 may have a structure in which a first buffer layer 111a and a second buffer layer 111b are stacked. The first semiconductor layer may include polycrystalline silicon.

The substrate 100 may include glass, a ceramic material, a metal material, or a flexible or bendable material. In the case where the substrate 100 is flexible or bendable, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 100 may have a multi-layered structure. For example, the substrate 100 may have a structure in which a first base layer 101, a first barrier layer 103, a second base layer 105, and a second barrier layer 107 are sequentially stacked. The first base layer 101 and the second base layer 105 may include the polymer resin. The first barrier layer 103 and the second barrier layer 107 may prevent the penetration of external foreign substances and may include a single layer or a multi-layer including an inorganic material such as silicon nitride ($SiN_x$) and silicon oxide ($SiO_x$).

Some regions of the first semiconductor layer may constitute the semiconductor layer of each of the first transistor T1, the second transistor T2, the fifth transistor T5, the sixth transistor T6, and the seventh transistor T7.

Semiconductor layers of the first transistor T1, the second transistor T2, the fifth transistor T5, the sixth transistor T6, and the seventh transistor T7 may respectively include channel regions, source regions S1, S2, S5, S6, and S7 and drain regions D1, D2, D5, D6, and D7. The source regions S1, S2, S5, S6, and S7 and the drain regions D1, D2, D5, D6, and D7 may respectively be on two opposite sides of the channel regions. For example, the source region and the drain region may be doped with impurities and may include p-type impurities. The source region and the drain region may respectively correspond to a source electrode and a drain electrode of a transistor (e.g., a suitable one of transistors T1-T7). The source region and the drain region may be exchanged with each other depending on the characteristic of the transistor. Hereinafter, terms a 'source region' and a 'drain region' are used instead of a source electrode and a drain electrode. FIGS. 11 and 12 show a channel region C1 of the first thin film transistor T1, a channel region C6 of the sixth thin film transistor T6, and a channel region C7 of the seventh thin film transistor T7.

The first gate insulating layer 112 may be arranged on the first semiconductor layer. The first gate electrode G1 of the first thin film transistor T1, the first scan line SL1, the fourth scan line SL4, and the emission control line EL may be arranged on the first gate insulating layer 112. The first scan line SL1, the fourth scan line SL4, and the emission control line EL may extend in the x-direction and may be apart from one another.

The first gate electrode G1 of the first thin film transistor T1 has an isolated pattern and overlaps the channel region C1 with the first gate insulating layer 112 therebetween.

A region of the first scan line SL1 that overlaps the channel region of the second thin film transistor T2 may include the gate electrode G2 of the second thin film transistor T2. A region of the fourth scan line SL4 that overlaps the channel region of the seventh thin film transistor T7 may include a gate electrode G7 of the seventh thin film transistor T7. Regions of the emission control line EL that overlap the fifth and sixth thin film transistors T5 and T6 may respectively include gate electrodes G5 and G6 of the fifth and sixth thin film transistors T5 and T6.

The second gate insulating layer 113 may be arranged on the gate electrode G1 of the first thin film transistor T1, the first scan line SL1, the fourth scan line SL4, and the emission control line EL.

An electrode voltage line HL, the first horizontal voltage line VL1b of the first initialization voltage line VL1, a bottom scan line 143 of the second scan line SL2, and a bottom scan line 145 of the third scan line SL3 may each extend in the x-direction and may be apart from each other.

The electrode voltage line HL may cover at least a portion of the gate electrode G1 of the first thin film transistor T1 and may serve as the second electrode CE2 of the first capacitor Cst. The electrode voltage line HL may include an opening SOP (see FIG. 11). The first capacitor Cst includes the first electrode CE1 and the second electrode CE2 and may overlap the first thin film transistor T1. The gate electrode G1 of the first thin film transistor T1 may also serve as the first electrode CE1 of the first capacitor Cst. For example, the gate electrode G1 of the first thin film transistor T1 and the first electrode CE1 may be formed as one body.

The interlayer insulating layer 114 may be arranged on the second gate insulating layer 113. A second semiconductor layer may be arranged on the interlayer insulating layer 114. The second semiconductor layer may include the semiconductor layer of each of the third thin film transistor T3 and the fourth thin film transistor T4. The second semiconductor layer may include zinc (Zn) oxide-based material, such as zinc (Zn) oxide, indium (In)-zinc (Zn) oxide, and gallium (Ga)-indium (In)-zinc (Zn) oxide. In an embodiment, the second semiconductor layer may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The semiconductor layers of the third thin film transistor T3 and the fourth thin film transistor T4 may respectively include the channel regions C3 and C4, source regions S3 and S4, and drain regions D3 and D4. The source regions S3 and S4 and the drain regions D3 and D4 are respectively on two opposite sides of the channel regions C3 and C4. The source regions S3 and S4 and the drain regions D3 and D4 of the third thin film transistor T3 and the fourth thin film transistor T4 may be formed by adjusting carrier concentration of an oxide semiconductor and making the source regions and the drain regions conductive. The source regions S3 and S4 and the drain regions D3 and D4 of the third thin film transistor T3 and the fourth thin film transistor T4 may be formed by increasing carrier concentration through plasma treatment that uses a hydrogen (H)-based gas, a fluorine (F)-based gas, or a combination thereof performed on the oxide semiconductor.

The second semiconductor layer may include the fourth electrode CE4 of the second capacitor Cbt. The fourth electrode CE4 of the second capacitor Cbt may be arranged between the semiconductor layer of the third thin film transistor T3 and the semiconductor layer of the fourth thin film transistor T4. The fourth electrode CE4 may extend from the semiconductor layer of the third thin film transistor T3 or the semiconductor layer of the fourth thin film transistor T4. A portion of the first scan line SL1 that overlaps the fourth electrode CE4 of the second capacitor Cbt may include the third electrode CE3 of the second capacitor Cbt.

The third gate insulating layer 115 may be arranged on the second semiconductor layer. The second horizontal voltage line VL2b of the second initialization voltage line VL2, a top scan line 163 of the second scan line SL2, and a top scan line 165 of the third scan line SL3 may extend in the x-direction on the third gate insulating layer 115. That is, the second scan line SL2 and the third scan line SL3 may each include two conductive layers arranged on different layers.

The top scan line 163 of the second scan line SL2 may overlap at least a portion of the bottom scan line 143. The top scan line 165 of the third scan line SL3 may overlap at least a portion of the bottom scan line 145.

A portion of the bottom scan line 143 of the second scan line SL2 overlapping the second semiconductor layer may include a bottom gate electrode G3a of the third thin film transistor T3, and a portion of the top scan line 163 overlapping the second semiconductor layer may include a top gate electrode G3b of the third thin film transistor T3.

A portion of the bottom scan line 145 of the third scan line SL3 overlapping the second semiconductor layer may include a bottom gate electrode G4a of the fourth thin film transistor T4, and a portion of the top scan line 165 overlapping the second semiconductor layer may include a top gate electrode G4b of the fourth thin film transistor T4. For example, the third thin film transistor T3 and the fourth thin film transistor T4 may each have a double-gate structure in which control electrodes are respectively provided on and under the semiconductor layer.

In some embodiments, the third gate insulating layer 115 may be patterned in a shape corresponding to the top scan line 163 of the second scan line SL2 and the top scan line 165 of the third scan line SL3.

A second interlayer insulating layer 116 may cover the third thin film transistor T3 and the fourth thin film transistor T4 on the third gate insulating layer 115. The first vertical voltage line VL1a of the first initialization voltage line VL1, a node electrode 171, and the connection electrodes 172, 173, 174, 175, and 176 may be arranged on the second interlayer insulating layer 116.

The first vertical voltage line VL1a of the first initialization voltage line VL1, the node electrode 171, and the connection electrodes 172, 173, 174, 175, and 176 may include a material having high conductivity such as a conductive oxide. For example, the first vertical voltage line VL1a of the first initialization voltage line VL1, the node electrode 171, and the connection electrodes 172, 173, 174, 175, and 176 may each include a single layer or a multi-layer including at least one of aluminum (Al), copper (Cu), and titanium (Ti). In some embodiments, the first vertical voltage line VL1a of the first initialization voltage line VL1, the node electrode 171, and the connection electrodes 172, 173, 174, 175, and 176 may each include a triple layer of Ti/Al/Ti that are sequentially arranged.

The second interlayer insulating layer 116 may include an inorganic material including oxide or nitride. For example, the second interlayer insulating layer 116 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The third gate insulating layer 115 and the second interlayer insulating layer 116 may constitute the inorganic insulating layer IIL shown in FIG. 7 in cooperation with the first gate insulating layer 112, the second gate insulating layer 113, and the interlayer insulating layer 114.

The first vertical voltage line VL1a of the first initialization voltage line VL1 may extend in the y-direction and be arranged between the left pixel circuit PCa and the right pixel circuit PCb. For example, the left pixel circuit PCa and the right pixel circuit PCb may be symmetric with respect to the first vertical voltage line VL1a of the first initialization voltage line VL1.

The first vertical voltage line VL1a of the first initialization voltage line VL1 may contact and may be electrically connected to the first horizontal voltage line VL1b of the first initialization voltage line VL1 through a contact hole (e.g., contact hole 37). Accordingly, wirings configured to apply the first initialization voltage Vint1 may have a mesh structure.

The first vertical voltage line VL1a may include a protrusion VL1ap protruding in the x-direction and overlapping the first horizontal voltage line VL1b. The protrusion VL1ap of the first vertical voltage line VL1a may contact and may be electrically connected to the source region S4 of the fourth thin film transistor T4 and the first horizontal voltage line VL1b through contact holes 36 and 37, respectively.

The node electrode 171 may contact and may be electrically connected to the gate electrode G1 of the first thin film transistor T1 and the second semiconductor layer through contact holes, respectively. One end of the node electrode 171 may be connected to the gate electrode G1 of the first thin film transistor T1 through the opening SOP of the second electrode CE2 of the first capacitor Cst. The other end of the node electrode 171 may be connected to the fourth electrode CE4 of the second capacitor Cbt.

One end of the connection electrode 172 may be electrically connected to the drain region D1 of the first thin film transistor T1 and the source region S6 of the sixth thin film transistor T6 through contact holes. The other end of the connection electrode 172 may be electrically connected to the drain region D3 of the third thin film transistor T3 through a contact hole.

The connection electrode 173 may be electrically connected to the source region S2 of the second thin film transistor T2 through a contact hole.

The connection electrode 174 may be electrically connected to the source region S5 of the fifth thin film transistor T5 and the electrode voltage line HL through contact holes, respectively.

One end of the connection electrode 175 may be electrically connected to the drain region D7 of the seventh thin film transistor T7 through a contact hole. The other end of the connection electrode 175 may be electrically connected to the second horizontal voltage line VL2b of the second initialization voltage line VL2 through a contact hole.

The connection electrode 176 may be electrically connected to the drain region D6 of the sixth thin film transistor T6 through a contact hole.

The first planarization layer 117a and the second planarization layer 117b may be stacked on the second interlayer insulating layer 116. The data line DL, the driving voltage line PL, and the connection metal CM may be arranged between the first planarization layer 117a and the second planarization layer 117b.

The data line DL, the driving voltage line PL, and the connection metal CM may include a conductive material including molybdenum (Mo), aluminum (Al), copper (Cu), and titanium (Ti) and include a single layer or a multi-layer. For example, the data line DL, the driving voltage line PL, and the connection metal CM may include a multi-layered structure of Ti/Al/Ti.

The data line DL may be electrically connected to the source region S2 of the second thin film transistor T2 by being connected to the connection electrode 173 through a contact hole.

The driving voltage line PL may be electrically connected to the electrode voltage line HL (e.g., the second electrode CE2 of the first capacitor Cst) by being connected to the connection electrode 174 through a contact hole. Accordingly, a wiring configured to apply the driving voltage ELVDD may have a mesh structure.

The connection metal CM may be connected to the connection electrode 176 through a contact hole, and the pixel electrode 121 may be connected to the connection metal CM through a via hole VIA and accordingly, the pixel electrode 121 may be electrically connected to the pixel circuit.

The pixel electrode 121 is arranged on the second planarization layer 117b, and the pixel-defining layer 119 is arranged on the second planarization layer 117b and covers the edges of the pixel electrode 121. Though FIGS. 11 and 12 show only the first emission layer 122b, various functional layers may be further arranged on and/or under the first emission layer 122b as described in FIG. 7.

A plurality of main sub-pixels Pm including the same pixel circuit as the pixel circuits PCa and PCb shown in FIG. 10 may be arranged in the first direction and the second direction. In this case, the first scan line SL1 and the fourth scan line SL4 may be shared by two pixel circuits neighboring each other in the y-direction.

For example, the fourth scan line SL4 may be electrically connected to the second thin film transistor of other pixel circuits PCa and PCb arranged over the pixel circuits PCa and PCb shown in FIG. 10 in the positive (+) y-direction in the drawing. Therefore, a fourth scan signal SS4 applied to the fourth scan line SL4 may be transferred, as a second scan signal, to the second thin film transistor of the other pixel circuits PCa and PCb. Likewise, the first scan line SL1 may be electrically connected to the seventh thin film transistor of other pixel circuits PCa and PCb arranged below the pixel circuits PCa and PCb shown in FIG. 10 in the negative (−) y-direction in the drawing. Therefore, a first scan signal SS1 applied to the first scan line SL1 may be transferred, as a fourth scan signal, to the seventh thin film transistor of the other pixel circuits PCa and PCb.

Figure 13:
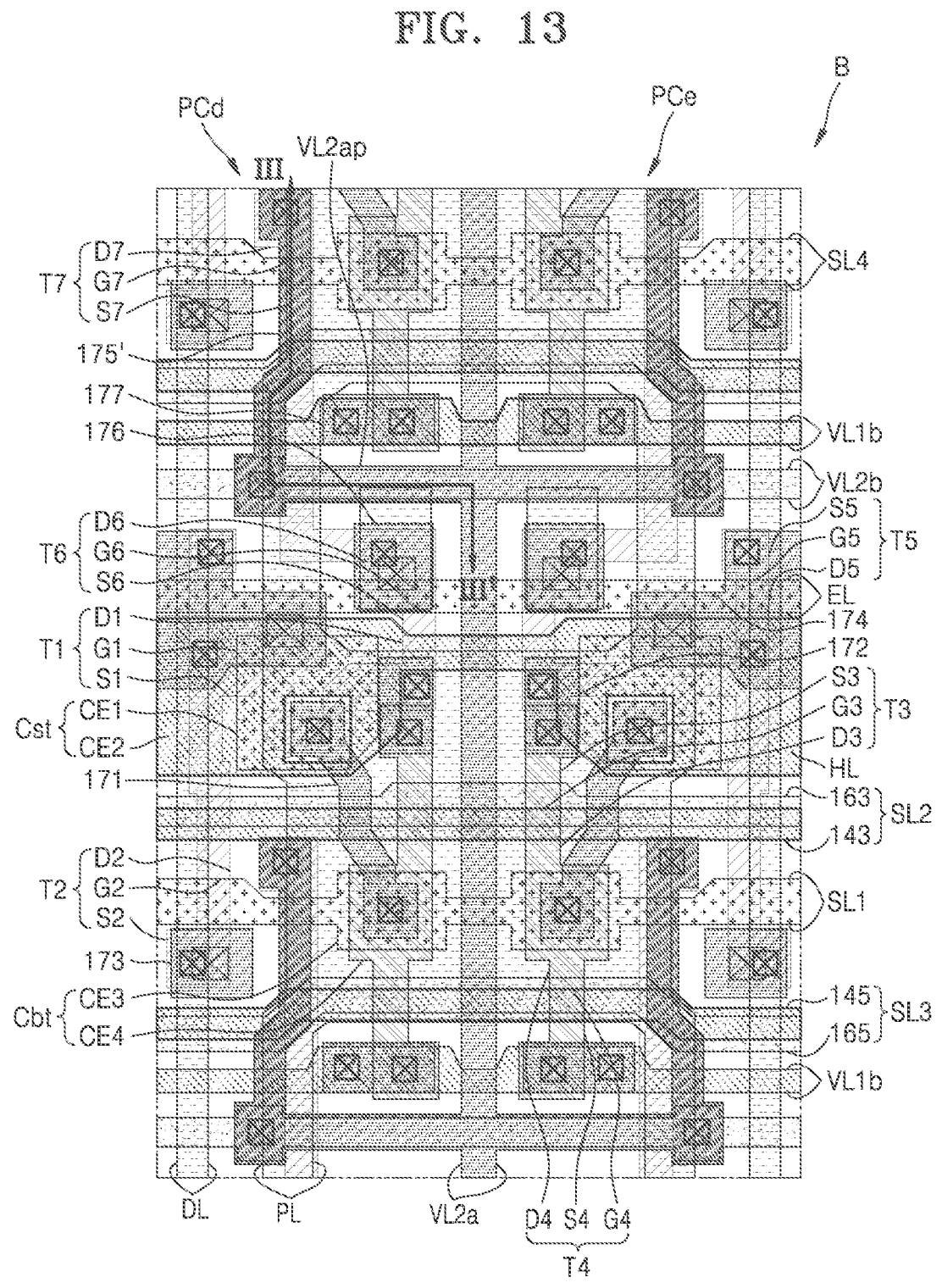
Figure 14:
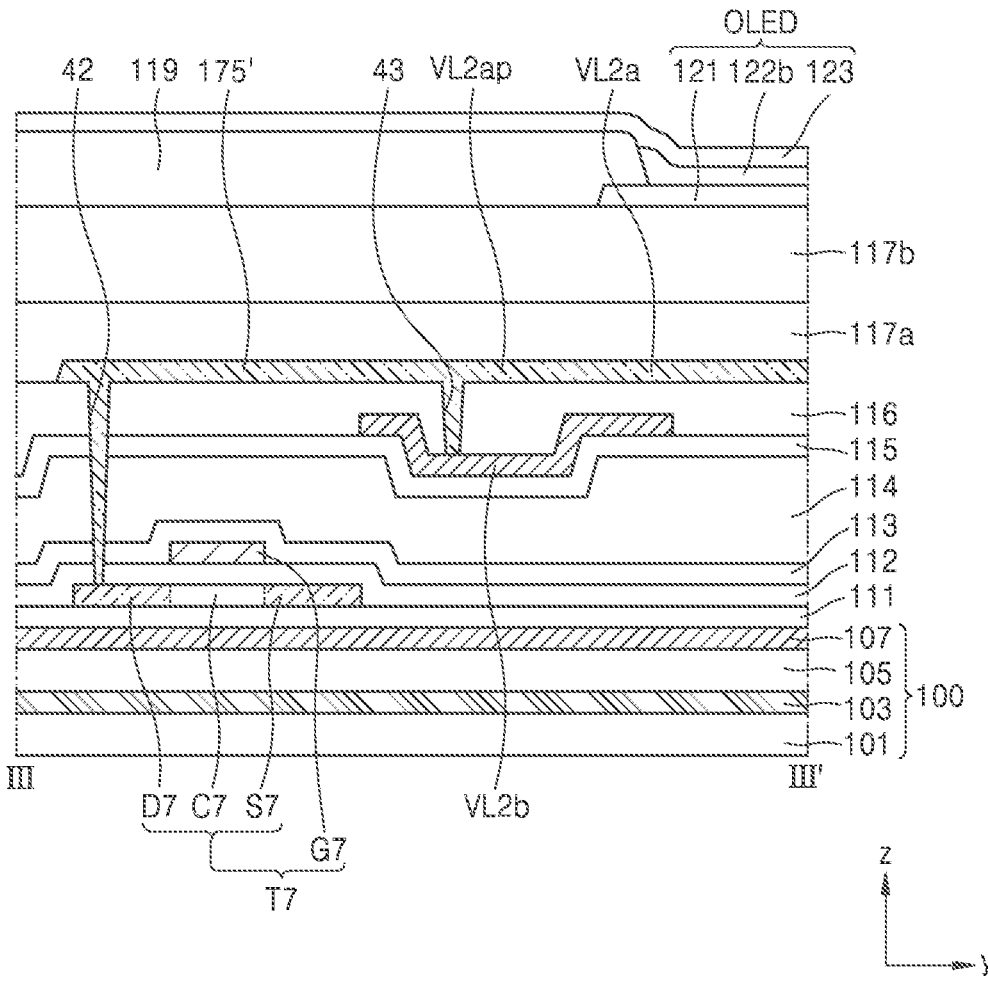
FIG. 14 is a cross-sectional view of the pixel circuit taken along the line III-III' of FIG. 13.

FIG. 13 is an enlarged plan view of pixel circuits arranged in a region B of FIG. 9. FIG. 14 is a cross-sectional view of the pixel circuit taken along the line III-III' of FIG. 13. Hereinafter, detailed descriptions of the same elements as those of FIGS. 10 to 12 are omitted and differences are mainly described.

FIG. 13 shows a pair of pixel circuits arranged on the same row of neighboring columns in the main display area MDA. FIG. 13 shows the pixel circuits arranged in a portion of the second area of the main display area MDA.

Referring to FIG. 13, the second vertical voltage line VL2a of the second initialization voltage line VL2 may extend in the y-direction and be arranged between a left pixel circuit PCd and a right pixel circuit PCe. For example, the left pixel circuit PCd and the right pixel circuit PCe may be symmetric with respect to the second vertical voltage line VL2a of the second initialization voltage line VL2.

Referring to FIG. 14 together with FIG. 13, the second vertical voltage line VL2a of the second initialization voltage line VL2 may contact and be electrically connected to the second horizontal voltage line VL2b of the second initialization voltage line VL2 through a contact hole 43. Accordingly, a wiring configured to apply the second initialization voltage Vint2 may have a mesh structure.

The second vertical voltage line VL2a may be arranged on the same layer as the first vertical voltage line VL1a of the first initialization voltage line VL1. The second vertical voltage line VL2a may be arranged on the second interlayer insulating layer 116.

The second vertical voltage line VL2a may further include a first protrusion portion VL2ap protruding in the x-direction and overlapping the second horizontal voltage line VL2b. The second vertical voltage line VL2a may further include a second protrusion portion 175' protruding in the positive (+) y-direction from the first protrusion portion VL2ap. The second vertical voltage line VL2a, the first protrusion portion VL2ap, and the second protrusion portion 175' may be formed as one body. The second vertical voltage line VL2a may be electrically connected to the second horizontal voltage line VL2b through the contact hole 43 in a region in which the first protrusion portion VL2ap intersects the second protrusion portion 175'. One end of the second protrusion portion 175' may be electrically connected to the drain region D7 of the seventh thin film transistor T7 through a contact hole 42. The second protrusion portion 175' may have a shape corresponding to the connection electrode 175 shown in FIG. 10 and may connect the seventh thin film transistor T7 to the second horizontal voltage line VL2b.

A connection electrode 177 may be further arranged over the second interlayer insulating layer 116. The connection electrode 177 may contact and may be electrically connected to the source region S4 of the fourth thin film transistor T4 and the first horizontal voltage line VL1b through contact holes 36 and 37, respectively.

The second vertical voltage line VL2a and the connection electrode 177 may each include a single layer or a multi-layer including at least one of aluminum (Al), copper (Cu), and titanium (Ti). In some embodiments, the second vertical voltage line VL2a and the connection electrode 177 may each include a triple layer of Ti/Al/Ti that are sequentially arranged.

Figure 15:
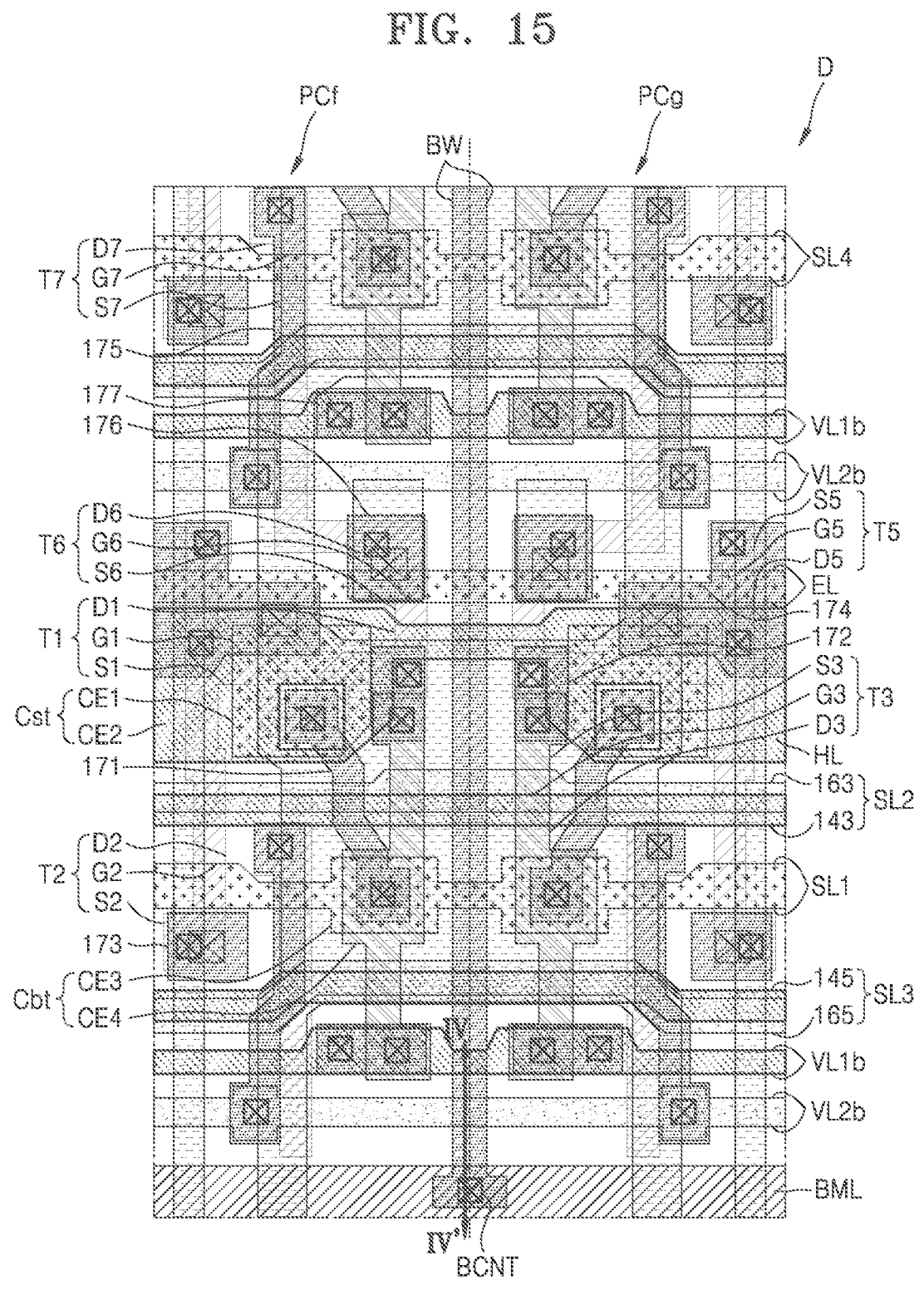
Figure 16:
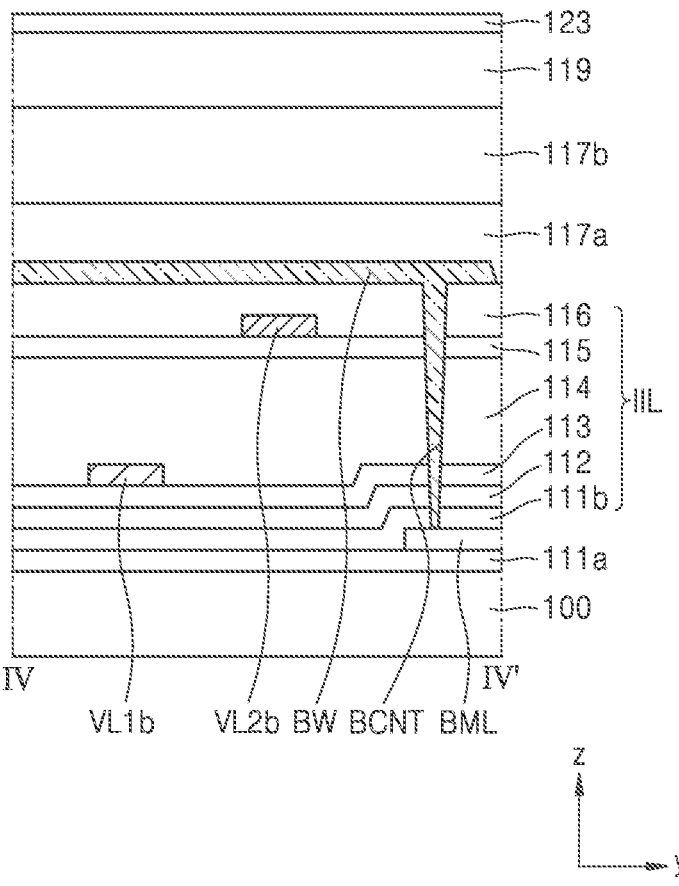
FIG. 16 is a cross-sectional view of the pixel circuit taken along the line IV-V' of FIG. 15.

FIG. 15 is an enlarged plan view of pixel circuits arranged in a region D of FIG. 9. FIG. 16 is a cross-sectional view of the pixel circuit taken along the line IV-V' of FIG. 15. FIG. 15 shows a pixel circuit arranged in a portion of the first area BWA of the main display area MDA. Hereinafter, detailed descriptions of the same elements as those of FIGS. 10-12 are omitted and differences are mainly described.

FIG. 15 shows a pair of pixel circuits arranged on the same row of neighboring columns in the first area BWA of the main display area MDA.

Referring to FIG. 15, the bias line BW may extend in the y-direction and may be arranged between a left pixel circuit PCf and a right pixel circuit PCg. For example, the left pixel circuit PCf and the right pixel circuit PCg may be symmetric with respect to the bias line BW.

The bias line BW may cross the first horizontal voltage line VL1b of the first initialization voltage line VL1 and the second horizontal voltage line VL2b of the second initialization voltage line VL2 and may extend in the y-direction. Referring to FIG. 16 together, the bias line BW may be arranged on the second interlayer insulating layer 116 and may be arranged at the same layer as the first vertical voltage line VL1a (see FIG. 11) of the first initialization voltage line VL1 and the second vertical voltage line VL2a (see FIG. 14) of the second initialization voltage line VL2.

The connection electrode 177 may be further arranged over the second interlayer insulating layer 116. The connection electrode 177 may contact and may be electrically connected to the source region S4 of the fourth thin film transistor T4 and the first horizontal voltage line VL1b through contact holes 36 and 37, respectively.

The bias line BW and the connection electrode 177 may each include a single layer or a multi-layer including at least one of aluminum (Al), copper (Cu), and titanium (Ti). In some embodiments, the bias line BW and the connection electrode 177 may each include a triple layer of Ti/Al/Ti that are sequentially arranged.

The bias line BW may be connected to the bottom metal layer BML arranged to correspond to the component area CA. The bias line BW may be connected to the bottom metal layer BML through a contact hole BCNT passing through the inorganic insulating layer IIL and the second buffer layer 111b. In some embodiments, unlike the drawing, an intermediate mediation electrode layer may be further provided to connect the bias line BW to the bottom metal layer BML.

Figure 17:
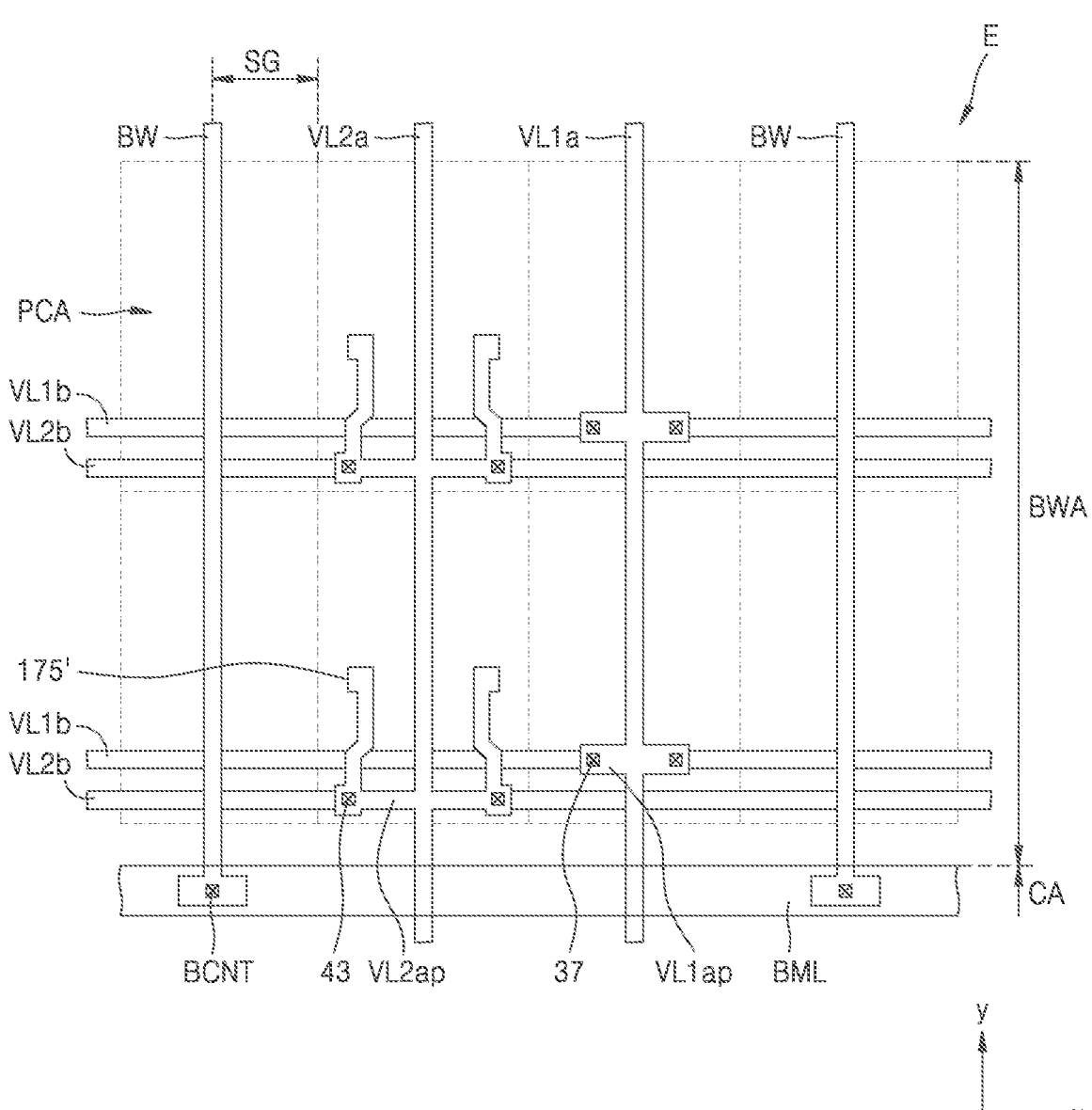
FIG. 17 is an enlarged plan view of vertical wirings arranged in a region E of FIG. 9.

FIG. 17 is an enlarged plan view of vertical wirings arranged in a region E of FIG. 9.

Referring to FIG. 17, the vertical wirings may include the bias line BW, the first vertical voltage line VL1a of the first initialization voltage line VL1, and the second vertical voltage line VL2a of the second initialization voltage line VL2 each extending in the y-direction.

In the first area BWA of the main display area MDA, the bias lines BW may be arranged with an interval (e.g., a preset interval) in the x-direction. The first vertical voltage line VL1a of the first initialization voltage line VL1 and the second vertical voltage line VL2a of the second initialization voltage line VL2 may be alternately arranged between a pair of bias lines BW. For example, the bias line BW, the first vertical voltage line VL1a, the second vertical voltage line VL2a, may be alternately arranged along the x-direction in the first area BWA. In the first area BWA, one of the bias line BW, the first vertical voltage line VL1a, and the second vertical voltage line VL2a may extend in the y-direction between a pair of neighboring columns. In the first area BWA, the bias line BW, the first vertical voltage line VL1a, and the second vertical voltage line VL2a may be alternately arranged with an interval of two columns. Assuming that a width occupied by a pixel circuit area PCA in the x-direction is a circuit gap SG, the bias line BW may be arranged with a six-circuit gap SG along the x-direction, for example, there may be six-circuit gap SG between the two nearest bias lines BW along the x-direction.

The first vertical voltage line VL1a of the first initialization voltage line VL1 may be electrically connected to the first horizontal voltage line VL1b arranged on a different layer. For example, the first vertical voltage line VL1a may include the protrusion portion VL1*ap* overlapping the first horizontal voltage line VL1*b*, and the protrusion portion VL1*ap* may contact and may be connected to the first horizontal voltage line VL1*b* through the contact hole 37. The first vertical voltage line VL1*a* may be arranged between pixel circuits arranged in a pair of left/right pixel circuit areas PCA.

The second vertical voltage line VL2*a* of the second initialization voltage line VL2 may contact and may be electrically connected to the second horizontal voltage line VL2*b* arranged on a different layer. For example, The second vertical voltage line VL2*a* may include the first protrusion portion VL2*ap* overlapping the second horizontal voltage line VL2*b*, and the first protrusion portion VL2*ap* may contact and may be connected to the second horizontal voltage line VL2*b* through the contact hole 43. The second vertical voltage line VL2*a* may further include the second protrusion portion 175' protruding from the first protrusion portion VL2*ap*. The second protrusion portion 175' may also serve as a connection electrode. The second vertical voltage line VL2*a* may be arranged between pixel circuits arranged in a pair of left/right pixel circuit areas PCA.

The bias line BW may pass through the first area BWA and may be connected to the edge portion of the bottom metal layer BML through the contact hole BCNT. The bias line BW may be arranged between pixel circuits arranged in a pair of left/right pixel circuit areas PCA. The bias line BW may cross (or overlap) the first horizontal voltage line VL1*b* of the first initialization voltage line VL1 and the second horizontal voltage line VL2*b* of the second initialization voltage line VL2.

Figure 18:
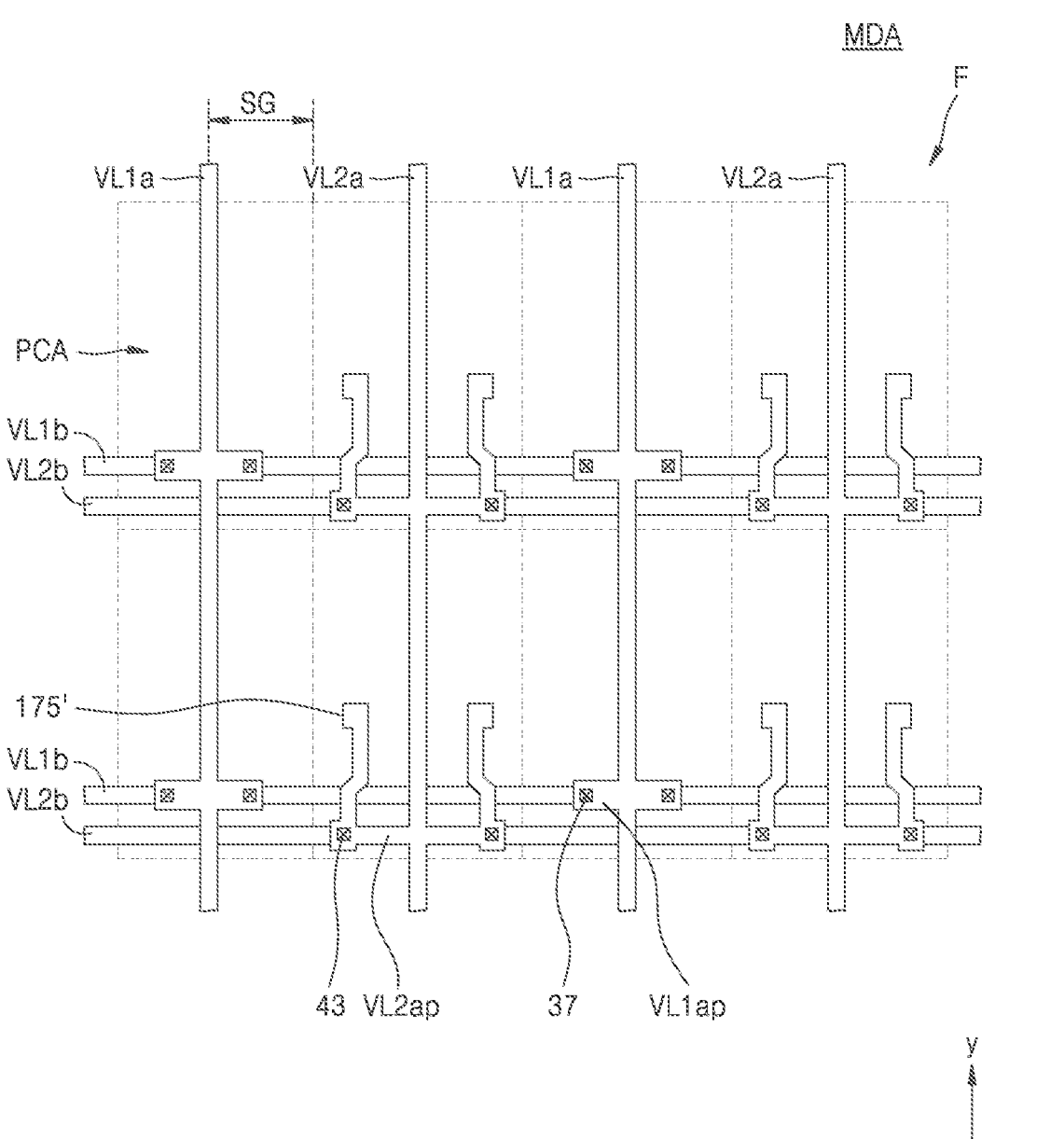
FIG. 18 is an enlarged plan view of vertical wirings arranged in a region F of FIG. 9.

FIG. 18 is an enlarged plan view of vertical wirings arranged in a region F of FIG. 9.

Referring to FIG. 18, the vertical wirings may include the first vertical voltage line VL1*a* of the first initialization voltage line VL1 and the second vertical voltage line VL2*a* of the second initialization voltage line VL2 each extending in the y-direction.

Referring to FIG. 18, in the second area of the main display area MDA excluding the first area BWA, the first vertical voltage line VL1*a* of the first initialization voltage line VL1 and the second vertical voltage line VL2*a* of the second initialization voltage line VL2 may be alternately arranged in the x-direction. In the second area, the first vertical voltage line VL1*a* and the second vertical voltage line VL2*a* may be alternately arranged with an interval of two columns. That is, one of the first vertical voltage line VL1*a* and the second vertical voltage line VL2*a* may be extend in the y-direction between a pair of neighboring columns in the second area. The first vertical voltage line VL1*a* of the first initialization voltage line VL1 and the second vertical voltage line VL2*a* of the second initialization voltage line VL2 may each be arranged with a four-circuit gap SG in the x-direction, for example, there may be four-circuit gap SG between any two first vertical voltage line VL1*a* or any two second vertical voltage line VL2*a*, along the x-direction.

Figure 19:
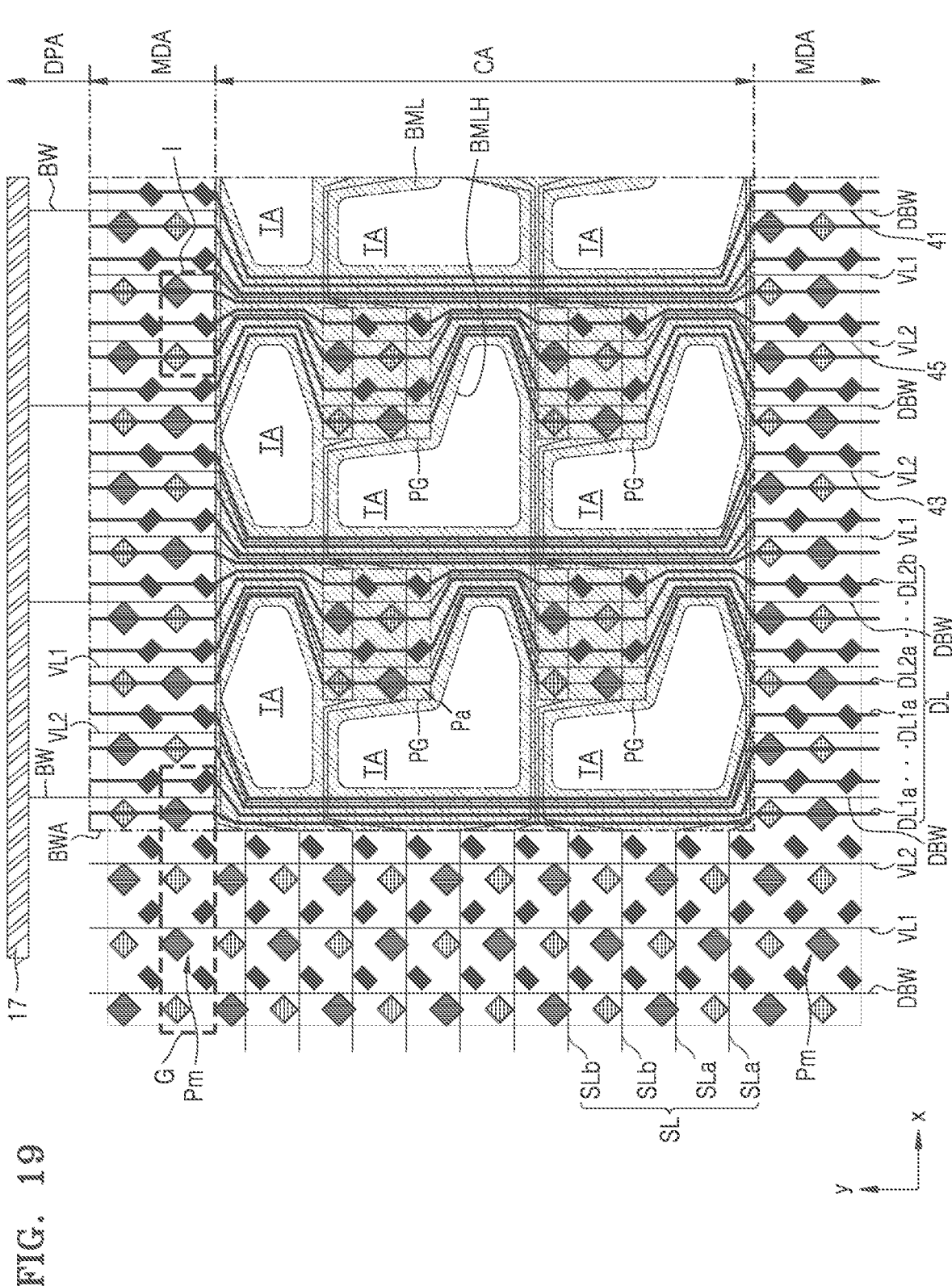
FIG. 19 is a plan view of a portion of a display panel according to one or more example embodiments.
Figure 20:
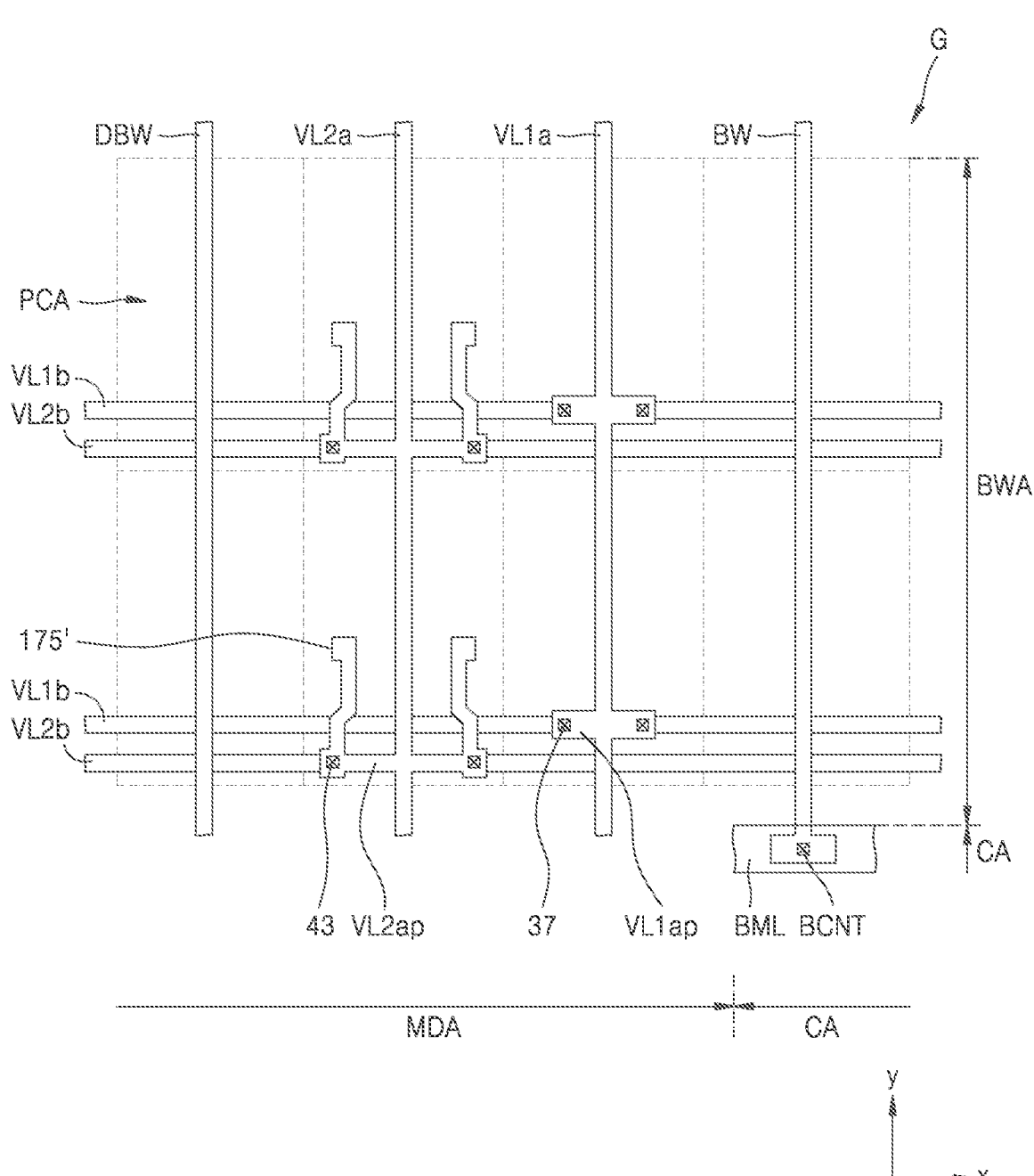
FIG. 20 is an enlarged plan view of vertical wirings arranged in a region G of FIG. 19.

FIG. 19 is a plan view of a portion of the display panel 10 according to one or more example embodiments. FIG. 20 is an enlarged plan view of vertical wirings arranged in a region G of FIG. 19. FIG. 19 shows a portion of the component area CA and a portion of the main display area MDA outside the component area CA. Though FIG. 9 shows only wirings required for description, more wirings may be omitted.

Referring to FIGS. 19 and 20, in the first area BWA of the main display area MDA, the bias lines BW are arranged with an interval (e.g., a preset interval) in the x-direction, and the first initialization voltage line VL1 and the second initialization voltage line VL2 may be arranged between a pair of bias lines BW. The first vertical voltage VL1*a* of the first initialization voltage line VL1 and the second vertical voltage line VL2*a* of the second initialization voltage line VL2 may be alternately arranged between a pair of bias lines BW. For example, in the first area BWA, one of the bias line BW, the first vertical voltage line VL1*a*, and the second vertical voltage line VL2*a* may extend in the y-direction between a pair of neighboring columns.

In some embodiments, in the second area of the main display area MDA excluding the first area BWA, dummy lines DBW may be arranged with the same interval as the bias lines BW in the first area BWA. The first initialization voltage line VL1 and the second initialization voltage line VL2 may be arranged between a pair of dummy lines DBW. For example, the first vertical voltage VL1*a* of the first initialization voltage line VL1 and the second vertical voltage line VL2*a* of the second initialization voltage line VL2 may be alternately arranged between a pair of dummy lines DBW (e.g., see FIG. 19).

The dummy line DBW may be arranged at the same layer as the bias line BW. The dummy line DBW may be arranged over the second interlayer insulating layer 116. The dummy line DBW may include a single layer or a multi-layer including at least one of aluminum (Al), copper (Cu), and titanium (Ti). In some embodiments, the dummy line DBW may include a triple layer of Ti/Al/Ti that are sequentially arranged.

The dummy line DBW may include a floating electrode which is not connected to the bias voltage supply line 17 and to which a voltage and/or a signal is not applied. Because the dummy line DBW is arranged in the region of the main display area MDA excluding the first area BWA, patterns in the entire main display area MDA may be unified. The dummy line DBW may be disconnected around the component area CA and thus may not be arranged in the component area CA.

In another embodiment, the dummy line DBW may be electrically connected to the first initialization voltage line VL1 or the second initialization voltage line VL2.

In some embodiments, because a portion of wirings vertically extending across the panel is used as a connection wiring (e.g., a bias line) that applies a bias voltage to the bottom metal layer BML of the component area CA, a separate space in which the connection wiring is arranged may not be used.

Though the above-described embodiments include the pixel circuit including n-channel metal oxide semiconductor (NMOS) field effect transistors (FET) and p-channel metal oxide semiconductor (PMOS) field effect transistors (FET), the example embodiments are not limited thereto. For example, one or more embodiments are similarly applicable to a display panel including sub-pixels connected to a pixel circuit including only NMOSFET or a pixel circuit including only PMOSFET and including a vertical wiring such as an initialization voltage line.

Though the above-described embodiments describe a display panel in which two kinds of initialization voltage lines are repeatedly arranged as vertical wirings in the horizontal direction, the example embodiments are not limited thereto. For example, the embodiments are similarly applicable to a display panel in which one kind of initialization voltage line is repeatedly arranged as the vertical wiring in the horizontal direction. For example, the bias line and the initialization voltage line may be alternately arranged in the horizontal direction in the first area BWA of the main display area MDA and the initialization voltage lines may be repeatedly arranged in the horizontal direction in the rest of the areas, or the dummy lines and the initialization voltage lines may be repeatedly arranged in the horizontal direction.

Though the first initialization voltage line and the second initialization voltage line are arranged at the same layer in the above-described embodiments, the embodiments are not limited thereto. For example, the first initialization voltage line VL1 and the second initialization voltage line VL2 may be arranged on different layers, and the bias line BW may be arranged at the same layer as the first initialization voltage line VL1 or the second initialization voltage line VL2.

As described above, the display panel and the display device according to the present embodiments include the bias line arranged at the same layer as the vertical wirings such as the initialization voltage line, wherein the bias line is connected to the bottom metal layer of the component area. Therefore, the characteristic of the display panel may be prevented from being changed by adjusting brightness through a voltage applied to the bottom metal layer through the bias line. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a first display element in a first display area of a substrate;
a second display element in a second display area of the substrate, the second display area comprising a transmission area;
a bottom metal layer in the second display area and between the substrate and the second display element; and
a bias line in the first display area and connected to the bottom metal layer,
wherein a resolution in the second display area is lower than a resolution in the first display area.

2. The display device of claim 1, further comprising a bias voltage supply line arranged in a peripheral area outside the first display area, the bias line being connected to the bias voltage supply line.

3. The display device of claim 1, further comprising:
a first pixel circuit connected to the first display element in the first display area; and
a second pixel circuit connected to the second display element in the second display area,
wherein the bottom metal layer is between the substrate and the second pixel circuit.

4. The display device of claim 3, further comprising a data line extending in a first direction, the data line being connected to the first pixel circuit and the second pixel circuit.

5. The display device of claim 3, further comprising a scan line extending in a first direction, the scan line being connected to the first pixel circuit and the second pixel circuit.

6. The display device of claim 1, further comprising an initialization voltage line in the first display area,
wherein the bias line and the initialization voltage line are extending in a first direction and alternately arranged along a second direction crossing the first direction, in a first region of the first display area.

7. The display device of claim 6, wherein the bias line is at a same layer as the initialization voltage line.

8. The display device of claim 6, wherein a voltage applied to the bias line is different from a voltage applied to the initialization voltage line.

9. The display device of claim 6, further comprising a voltage line in the first display area, extending the second direction and connected to the initialization voltage line.

10. The display device of claim 6, further comprising a dummy line in a second region of the first display area and extending in the first direction,
wherein the dummy line and the initialization voltage line are alternately arranged along the second direction in the second region.

11. The display device of claim 10, wherein the dummy line is at a same layer as the bias line.

12. The display device of claim 10, wherein the dummy line is a floating line.

13. The display device of claim 10, wherein the dummy line is electrically connected to the initialization voltage line.

14. The display device of claim 1, wherein a hole is defined in bottom metal layer and the hole corresponds to the transmission area.

* * * * *